United States Patent
Guo et al.

(10) Patent No.: US 8,236,152 B2
(45) Date of Patent: *Aug. 7, 2012

(54) DEPOSITION SYSTEM

(75) Inventors: George X. Guo, Palo Alto, CA (US); Kai-an Wang, Cupertino, CA (US)

(73) Assignee: Ascentool International Ltd., Mountain View, CA (US)

( * ) Notice: Subject to any disclaimer, the term of this patent is extended or adjusted under 35 U.S.C. 154(b) by 1235 days.

This patent is subject to a terminal disclaimer.

(21) Appl. No.: 11/563,116

(22) Filed: Nov. 24, 2006

(65) Prior Publication Data

US 2008/0121514 A1    May 29, 2008

(51) Int. Cl.
- C25B 9/00 (2006.01)
- C25B 11/00 (2006.01)
- C25B 13/00 (2006.01)
- C23C 14/00 (2006.01)

(52) U.S. Cl. ......... 204/298.23; 204/298.02; 204/298.17; 204/298.19; 204/298.26

(58) Field of Classification Search ............. 204/192.26, 204/298.28, 192.12, 298.17, 298.19, 298.02, 204/298.23, 298.26
See application file for complete search history.

(56) References Cited

U.S. PATENT DOCUMENTS

| | | | | |
|---|---|---|---|---|
| 4,221,652 A | * | 9/1980 | Kuriyama | 204/298.22 |
| 4,374,722 A | * | 2/1983 | Zega | 204/298.03 |
| 4,417,968 A | * | 11/1983 | McKelvey | 204/192.12 |
| 4,443,318 A | * | 4/1984 | McKelvey | 204/298.23 |
| 5,196,101 A | * | 3/1993 | Thakoor | 204/192.26 |
| 526,202 A | | 11/1993 | Manley | |
| 5,333,726 A | | 8/1994 | Makowiecki | |
| 5,374,343 A | | 12/1994 | Sasaki | |
| 575,309 A | | 5/1998 | Hollar | |
| 5,747,119 A | | 5/1998 | Hirata | |
| 5,755,938 A | | 5/1998 | Fukui | |
| 5,953,827 A | | 9/1999 | Or | |
| 5,985,115 A | | 11/1999 | Hartsough | |
| 6,080,287 A | | 6/2000 | Drewery | |
| 6,113,752 A | | 9/2000 | Hollstein | |
| 6,207,026 B1 | | 3/2001 | Crocker | |
| 6,221,217 B1 | | 4/2001 | Moslehi | |
| 6,235,634 B1 | | 5/2001 | White | |
| 6,238,532 B1 | | 5/2001 | Rossnagel | |
| 6,290,826 B1 | * | 9/2001 | Obinata et al. | 204/298.28 |
| 632,885 A1 | | 12/2001 | Felsenthal | |
| 6,413,380 B1 | | 7/2002 | Pinarbasi | |
| 6,454,920 B1 | | 9/2002 | Haag | |
| 6,641,701 B1 | | 11/2003 | Tepman | |
| 6,692,618 B2 | | 2/2004 | Dubs | |
| 6,730,194 B2 | | 5/2004 | Schertler | |
| 6,740,585 B2 | | 5/2004 | Yoon | |
| 6,758,948 B2 | | 7/2004 | Johnson | |
| 7,578,908 B2 | * | 8/2009 | Hockley et al. | 204/192.12 |
| 2008/0121620 A1 | * | 5/2008 | Guo et al. | 216/67 |

FOREIGN PATENT DOCUMENTS

JP    2004346387 A  * 12/2004

* cited by examiner

Primary Examiner — Jonathan Johnson
Assistant Examiner — Michael Band
(74) Attorney, Agent, or Firm — SV Patent Service

(57) ABSTRACT

A deposition system includes a chamber, a plurality of targets in a center region in the chamber and a plurality of substrates in the chamber. The targets are sequentially positioned when viewed in a first direction. At least one of the targets includes a sputtering surface facing outward. The substrates are sequentially positioned when viewed in the first direction. At least one of the substrates includes a deposition surface configured to receive material sputtered off the sputtering surface.

19 Claims, 29 Drawing Sheets

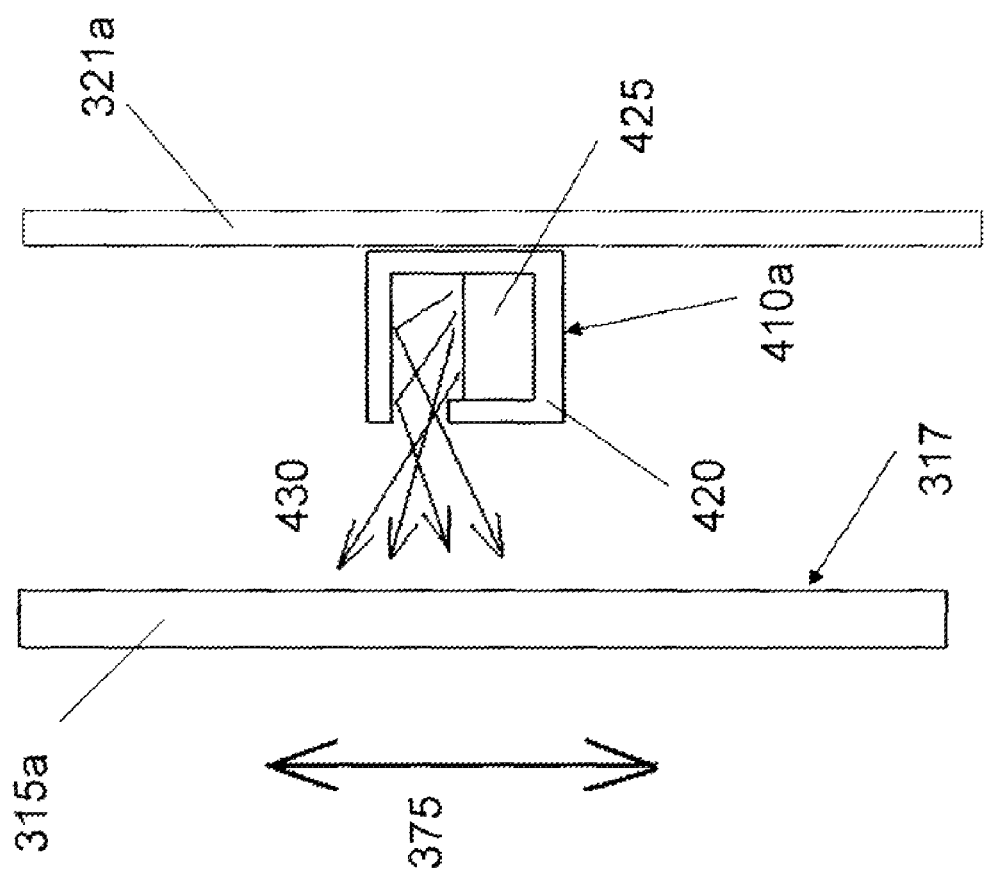

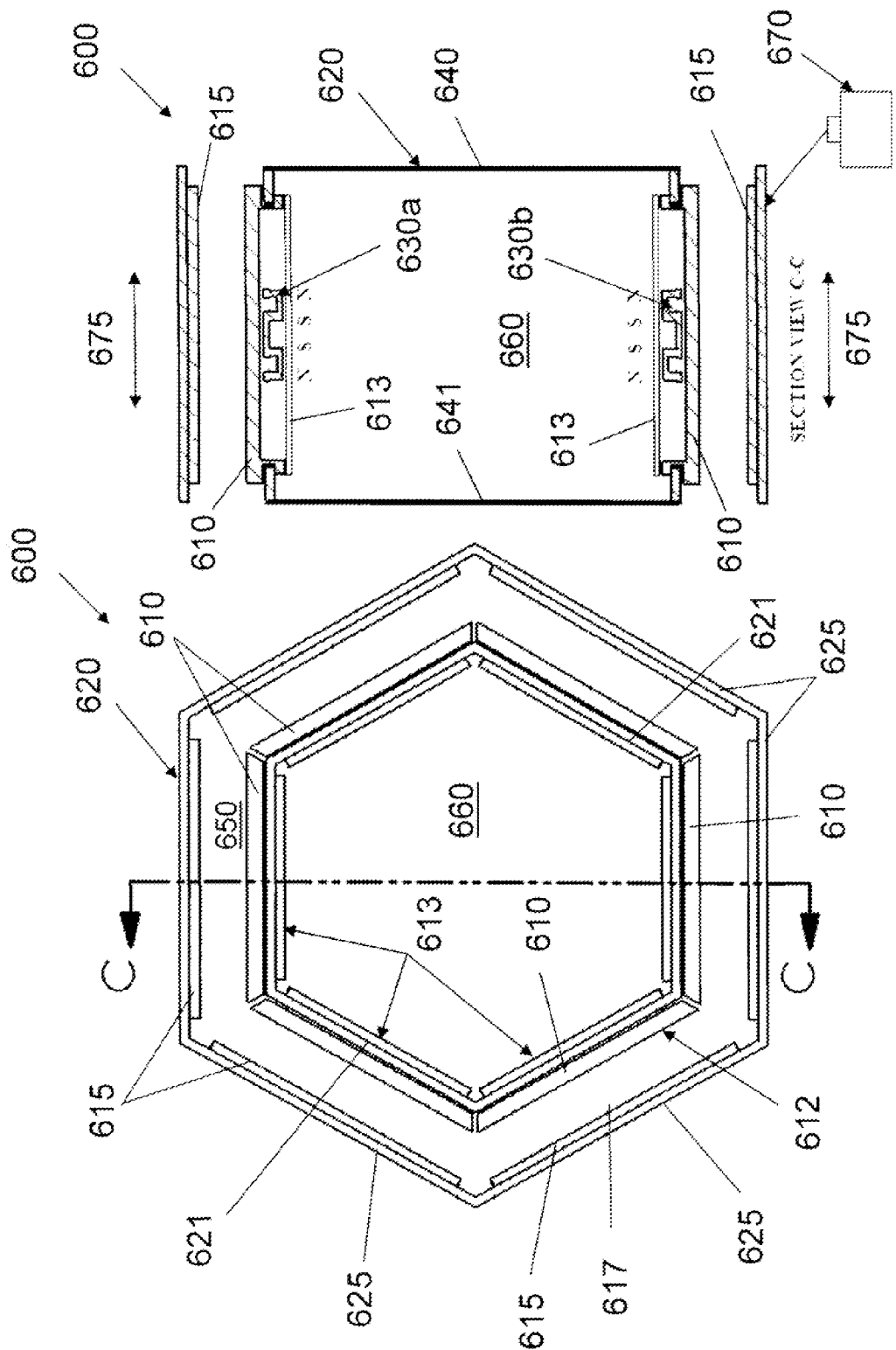

DEPOSITION SYSTEM

TECHNICAL FIELD

This application relates to an apparatus for depositing material on a substrate.

BACKGROUND

Material deposition is widely used in window glass coating, flat panel display manufacturing, coating on flexible films (such as webs), hard disk coating, industrial surface coating, semiconductor wafer processing, photovoltaic panels, and other applications. Target materials are sputtered or vaporized from a source and deposited on a substrate. One desirable feature for material deposition is to maximize the utilization and to minimize waste of target materials. Another desirable feature for material deposition is to achieve uniform deposition across the substrates.

Different designs exist in the conventional deposition systems for large substrates. But the designs all have different drawbacks. In a first example, referring to FIGS. 1A-1D, a deposition system 100 includes a long narrow rectangular target 110 over a large substrate 115 in a vacuum chamber 120. A magnetron 130 is held behind the target 110. The substrate 115 can be transported in the direction 150 relative to the target 110 and the magnetron 130 to receive a uniform deposition across the top surface of the substrate 115. The magnetron 130 is stationary relative to the target 110. The deposition system 100 can also includes a power supply 140 that can produce an electric bias between the target and walls of the vacuum chamber 120.

The magnetron 130 includes a magnetic pole 132 of a first polarity and a magnetic pole 135 of a second polarity opposite to the first polarity. The magnetron 130 can produce magnetic flux outside of the sputtering surface 112 on the lower side of the target 110 as shown in FIG. 1B. More electrons can be confined near the magnetic field parallel to the sputtering surface 112 wherein the magnetic field strength is at local maximum. The locations having the locally maximum magnetic field strength can form a close loop that can guide the migration path for free electrons. The closed-loop magnetic field can enhance the ionization efficiency of the sputtering gas (i.e. the plasma) for more effective confining electrons near the sputtering surface 112. The enhanced ionization can also lower the operating pressure during sputter deposition.

A drawback of the deposition system 100 is that a non-uniform erosion pattern 115 is often formed over the sputtering surface 112 of the target 110 after repeated sputtering operations. The erosion pattern 115 usually tracks the location where the magnetic field strength is at local maximum and where the sputtering gas is the most enhanced. The erosion pattern 115 include a close-looped groove as shown in FIG. 1D. The non-uniform erosion can result in low target utilization and re-deposition of sputtered target materials on the areas of the sputtering surface 112 having low magnetic field strength. Some of the accumulated materials can fall off the target 110 and cause undesirable particles to be deposited on the substrate 115. Another disadvantage of the deposition system 100 is that the larger dimension of target needs to be wider than the width of the substrate to achieve good deposition uniformity; some sputtered material will unavoidably not reach the substrate surface and thus be wasted. Referring to FIGS. 2A and 2B, another conventional deposition system 200 includes a large target 210 having a sputtering surface 212, a vacuum chamber 220, and a magnetron 230 on the back side (opposite to the sputtering surface 212) of the large target 210. The magnetron 230 can scan across along the direction 250. The substrate 215 is held over a substrate holder 217. The substrate 215 can remain stationary during the deposition if a target has dimensions larger than the substrate 215. The scanning of the magnetron 230 relative to target 210 can cause target materials to be sputtered off different portions of the target surface to deposition on the deposition surface 217 along directions 260. To achieve uniform deposition, the target 210 is typically larger than the deposition surface on the substrate.

The disadvantages of the deposition system 200 include the requirement of a large and expensive target, as described above. Another disadvantage is the difficulty to achieve uniform deposition. Only the outermost part of the closed loop erosion track of the magnetron 230 can reach edge of the target 210, which tends to lower the sputtering at the edges of the target 210 and to cause non-uniform deposition over the substrate 215. Typically the target is significantly larger than substrate to achieve good deposition uniformity. More material and electrical power is used to deposit films on substrate due to extra deposition outside the substrate area. Another disadvantage of the deposition system 200 is that certain amount of the sputtered materials may be wasted. For example, the material sputtered in directions 260a and 260b cannot arrive at the deposition surface 217.

SUMMARY

In one aspect, the present invention relates to a deposition system including a chamber; a plurality of targets in a center region in the chamber, wherein the plurality of targets are sequentially positioned when viewed in a first direction and at least one of the plurality of targets comprises a sputtering surface facing outward; and a plurality of substrates in the chamber, wherein the plurality of substrates are sequentially positioned when viewed in the first direction and at least one of the plurality of substrates comprises a deposition surface configured to receive material sputtered off the sputtering surface.

In another aspect, the present invention relates to a deposition system including a chamber; a plurality of targets in a center region in the chamber, wherein the plurality of targets are distributed in an inner close-loop and a gap between two adjacent targets in the inner close-loop is smaller than one tenth of at least one dimension of one of the two adjacent targets; and a plurality of substrates in the chamber and outside of the inner close-loop, wherein at least one of the plurality of targets comprises a sputtering surface facing outward and at least one of the plurality of substrates comprises a deposition surface configured to receive material sputtered off the sputtering surface.

In another aspect, the present invention relates to a method for deposition. The method includes positioning a plurality of targets in a first sequence in a center region of a chamber, wherein at least one of the plurality of targets comprises a sputtering surface facing outward; and positioning a plurality of substrates in a second sequence in the chamber, wherein at least one of the plurality of substrates comprises a deposition surface configured to receive a material sputtered off the sputtering surface.

In another aspect, the present invention relates to a processing system including a chamber; a plurality of processing stations in a center region in the chamber, wherein the plurality of processing stations are sequentially positioned when viewed in a first direction, wherein the plurality of processing stations is configured to provide at least one processing step selected from the group consisting of thermal evaporation, thermal sublimation, sputtering, chemical vapor deposition (CVD), plasma enhanced chemical vapor deposition (PECVD), ion etching, or sputter etching; and a plurality of substrates in the chamber, wherein the plurality of substrates are sequentially positioned when viewed in the first direction, and at least one of the plurality of substrates comprises a receiving surface configured to receive the at least one processing step from the plurality of processing stations.

In another aspect, the present invention relates to a processing system including a chamber; a plurality of processing stations in a center region in the chamber, wherein the plurality of processing stations are distributed in an inner close-loop and are configured to provide at least one processing step selected from the group consisting of thermal evaporation, thermal sublimation, sputtering, chemical vapor deposition (CVD), plasma enhanced chemical vapor deposition (PECVD), ion etching, or sputter etching; and a plurality of substrates in the chamber and outside of the inner close-loop, wherein at least one of the plurality of substrates comprises a receiving surface facing the inner close-loop, and wherein the receiving surface is configured to receive the at least one processing step from the plurality of processing stations.

In another aspect, the present invention relates to a method for processing one or more substrates. The method includes positioning a plurality of processing stations in a first sequence in a center region of a chamber, wherein the plurality of processing stations is configured to provide at least one processing step selected from the group consisting of thermal evaporation, thermal sublimation, sputtering, chemical vapor deposition (CVD), plasma enhanced chemical vapor deposition (PECVD), ion etching, or sputter etching; and positioning a plurality of substrates in a second sequence in the chamber, wherein at least one of the plurality of substrates comprises a receiving surface configured to receive the at least one processing step from the plurality of processing stations.

Implementations of the system may include one or more of the following. The deposition surface can be substantially facing the central region. The deposition surface can be substantially parallel to the sputtering surface. The sputtering surface and the deposition surface can be substantially parallel to the first direction. A gap between at least two adjacent targets in the plurality of targets can be smaller than half of at least one dimension of one of the two adjacent targets when viewed in the first direction. A gap between at least two adjacent substrates in the plurality of substrates can be smaller than half of at least one dimension of one of the two adjacent substrates when viewed in the first direction. The plurality of targets can be distributed in an inner close-loop in the center region and the plurality of substrates can be positioned outside of the inner close-loop. A gap between two adjacent targets in the inner close-loop can be smaller than half of at least one dimension of one of the two adjacent targets. The plurality of substrates can be distributed in an outer close-loop outside of the inner close-loop. The gap between two adjacent substrates in the outer close-loop can be smaller than half of at least one dimension of one of the two adjacent substrates. The deposition system can further include a magnetron source configured to produce a magnetic field near the sputtering surface on at least one of the plurality of targets. A dimension of at least one of the plurality of targets in the first direction can be smaller than a dimension of at least one of the plurality of substrates in the first direction. A dimension of at least one of the plurality of targets can be smaller than a dimension of at least one of the plurality of substrates in a second direction perpendicular to the first direction. The deposition system can further include a transport mechanism configured to produce a relative movement between at least one of the plurality of substrates and at least one of the plurality of targets along the first direction. At least one of the plurality of substrates can be configured to receive material sputtered off from two of the plurality of targets. At least one of the plurality of substrates can include a web that is configured to be conveyed by a transport mechanism. The chamber can include one or more outer walls forming an enclosure around the plurality of substrates and the plurality of targets. The one or more outer walls can include a cylindrical surface.

Implementations of the system may include one or more of the following. At least one of the plurality of processing stations can include a target having a sputtering surface facing outward, wherein the receiving surface is configured to receive material sputtered off the sputtering surface. The processing system can further include a magnetron source configured to produce a magnetic field near the sputtering surface on one of the plurality of targets. A dimension of at least one of the plurality of targets in the first direction can be smaller than a dimension of at least one of the plurality of substrates in the first direction. A dimension of at least one of the plurality of targets can be smaller than a dimension of at least one of the plurality of substrates in a second direction perpendicular to the first direction. The receiving surface can be substantially facing the central region. The plurality of processing stations can be distributed in an inner close-loop in the center region and the plurality of substrates can be positioned outside of the inner close-loop. A gap between two processing stations in the inner close-loop can be smaller than half of at least one dimension of one of the two adjacent processing stations. The plurality of substrates can be distributed in an outer close-loop outside of the inner close-loop. The gap between two adjacent substrates in the outer close-loop can be smaller than half of at least one dimension of one of the two adjacent substrates. The processing system can further include a transport mechanism configured to transport at least one of the plurality of substrates along the first direction. At least one of the plurality of substrates can receive processing steps from two of the plurality of processing stations. At least one of the plurality of substrates can include a web that is configured to be conveyed by a transport mechanism. The chamber can include one or more outer walls forming an enclosure around the plurality of substrates and the plurality of targets. At least one of the one or more of outer walls can include a cylindrical surface. The processing system can further include a second processing station juxtaposed to one of the plurality of processing stations in the first direction, wherein the second processing station and the one of the plurality of processing stations are configured to provide two or more processing steps to the same receiving surface on one of the plurality of substrates. The two ore more processing steps can be selected from the group consisting of thermal evaporation, thermal sublimation, sputtering, chemical vapor deposition (CVD), plasma enhanced chemical vapor deposition (PECVD), ion etching, or sputter etching. The processing system can further include a transport mechanism configured to transport the one of the plurality of substrates along the first direction to allow the receiving surface to receive processing steps from the second processing station and the one of the plurality of processing stations.

Embodiments may include one or more of the following advantages. The disclosed system can provide efficient and uniform material deposition in thin-film deposition, substrate etching, DC/RF diode or magnetron sputter processing system, thermal evaporation or thermal sublimation processing system, chemical vapor deposition or plasma enhanced chemical vapor processing system, ion beam assisted deposition or etching system, sputter etch, plasma etch, or reactive ion etch system.

The disclosed magnetron source in a deposition system can improve target utilization and reduce target cost by using a target that is smaller than the substrate. The disclosed system can improve the collection of the sputtered materials by enclosing the targets by a plurality of substrates. The disclosed systems can utilize thick targets to allow longer deposition cycles between target changes, thus reducing scheduled system down time. The disclosed magnetron source can improve target utilization and reduce target cost by reducing the unevenness in the erosion of the target.

In the disclosed systems, different sources such as for thermal evaporation, thermal sublimation, sputtering, CVD, PECVD, ion generating source, or etching can be positioned in a central region surrounded by a plurality of substrates with deposition surfaces facing the center. Particles, ions, atoms, molecules, etc can move outward from the different sources to the substrate surfaces. The various sources can be positioned close to each other to achieve the improved uniformity. The substrates can be placed adjacent to each other to achieve the best material collection of the source materials.

The deposition and etch systems can provide deposition on large substrate while occupying relatively small footprint. The disclosed deposition and etch systems can simultaneously deposit on a plurality of large substrates. The substrates can be rigid or flexible. For example, the substrates can include webs that are fed in rolls.

The disclosed processing system can also generate high sputtering rate for magnetic and ferromagnetic target materials. The disclosed processing system can also allow material compositions to be controlled and varied. The disclosed processing system can also allow different processing such as sputtering and ion etching to be conducted on the same substrate in the same vacuum environment. The disclosed deposition and etch systems can use less electrical power, less chemicals and less source materials compared to conventional processing system.

The details of one or more embodiments are set forth in the accompanying drawings and in the description below. Other features, objects, and advantages of the invention will become apparent from the description and drawings, and from the claims.

BRIEF DESCRIPTION OF THE DRAWINGS

FIG. 4B is cross-sectional view of an exemplified thermal evaporation source of FIG. 4A.

FIG. 6B is a top view of the processing system of FIG. 6A with the targets arranged in one configuration.

FIG. 6C is a side cross-sectional view of the processing system of FIG. 6B along the line C-C.

DETAILED DESCRIPTION

Figure 1A:
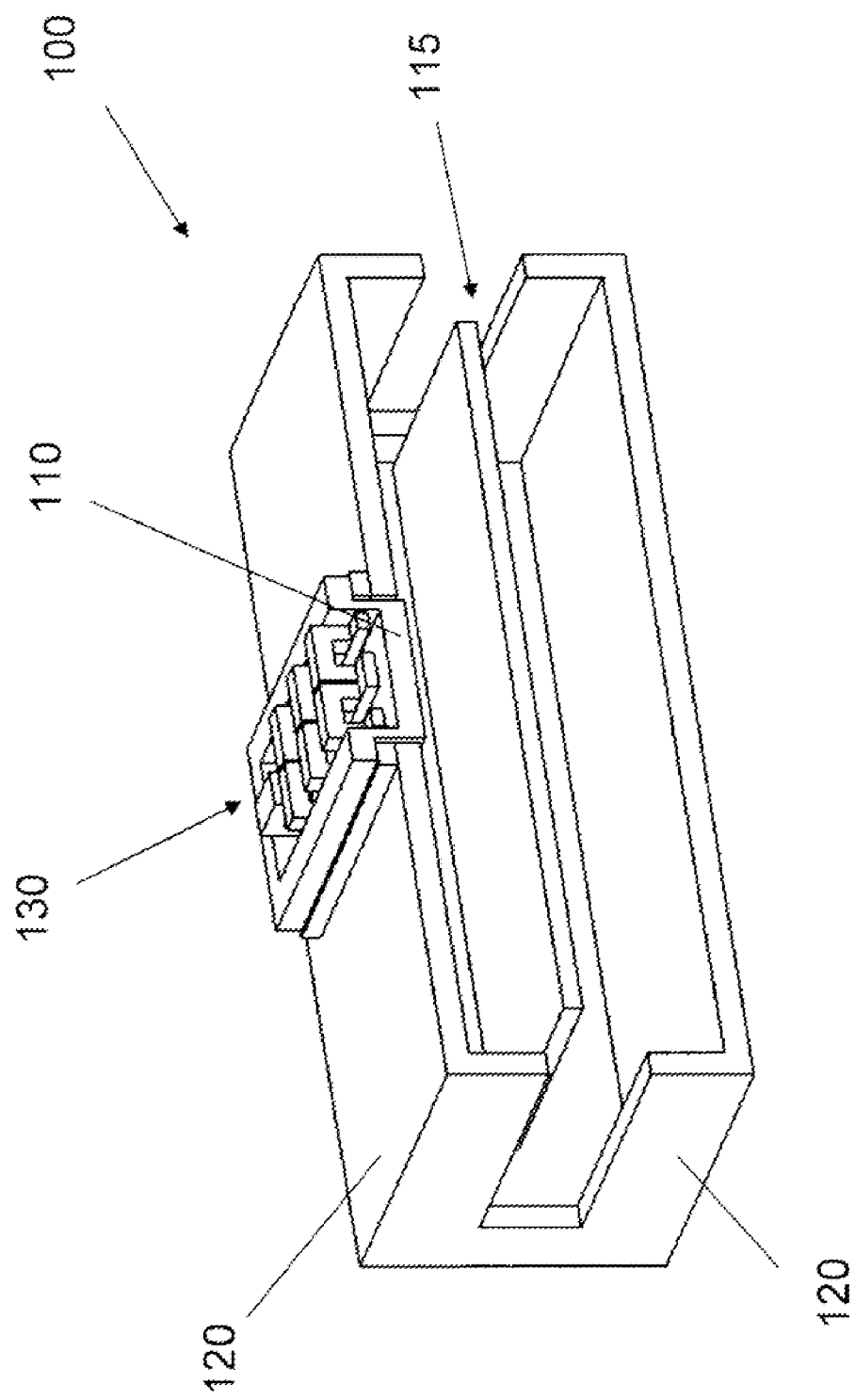
FIG. 1A illustrates a cross section of a conventional deposition system.
Figure 1B:
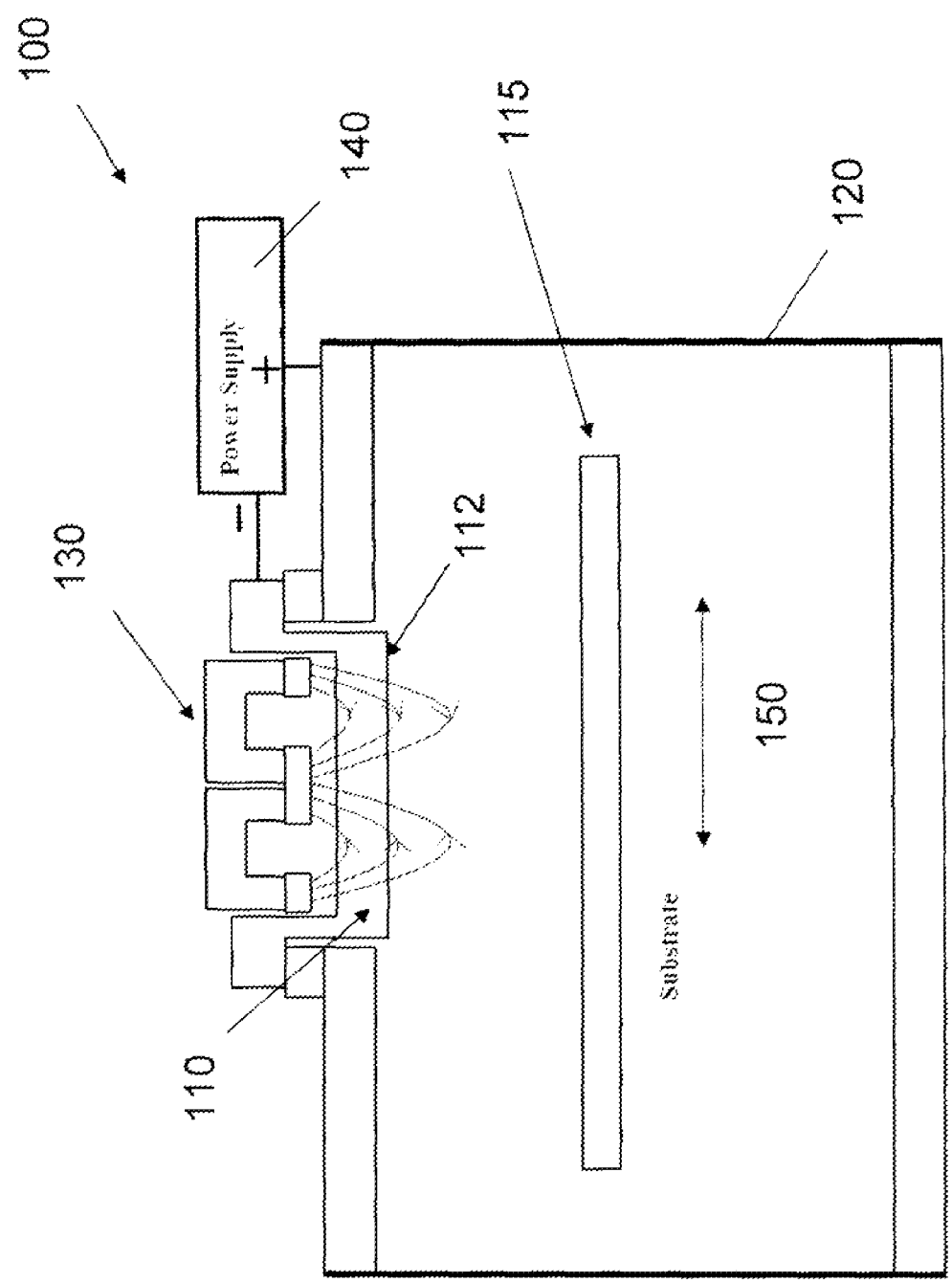
FIG. 1B is a cross-sectional view of the conventional deposition system of FIG. 1A.
Figure 1C:
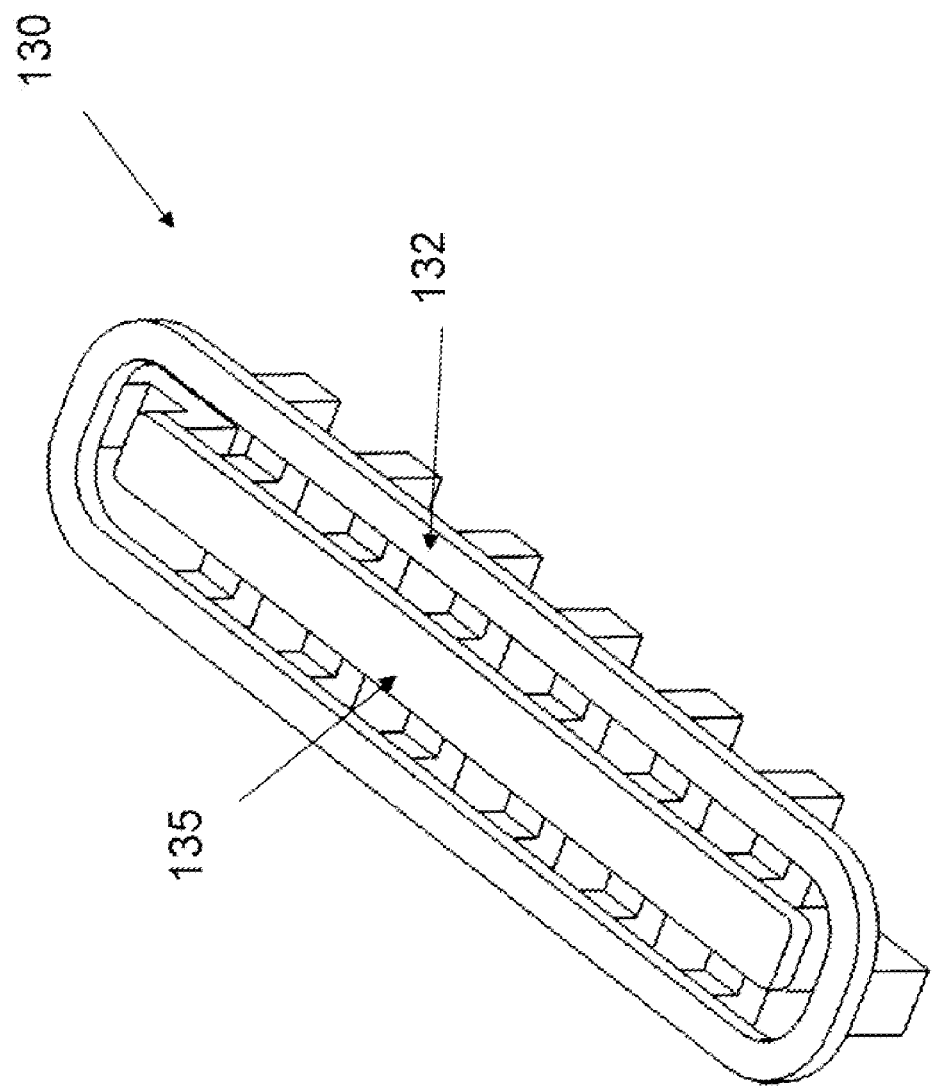
FIG. 1C is a bottom perspective view of the magnetron source in the conventional deposition system of FIG. 1A.
Figure 1D:
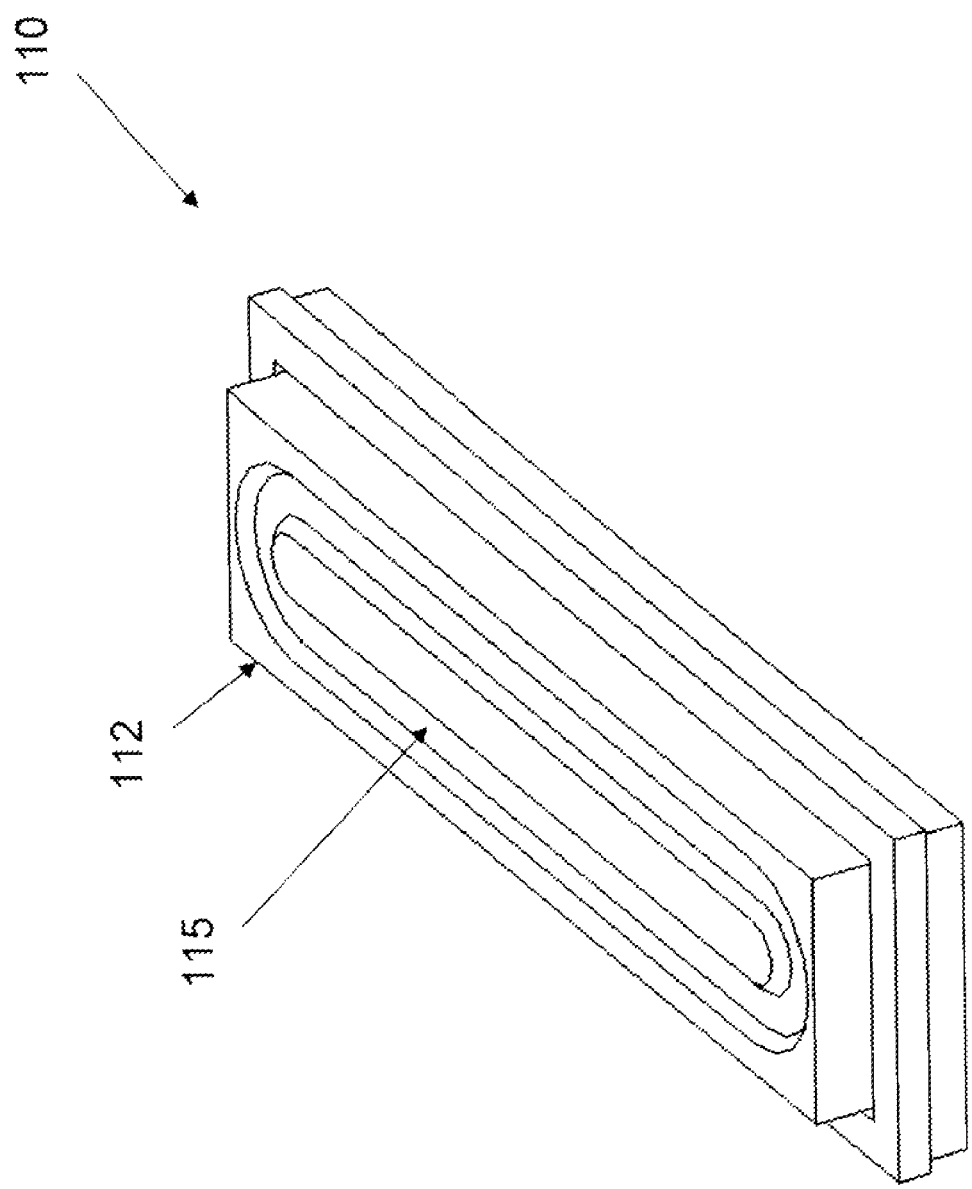
FIG. 1D is a bottom perspective view of the target and the erosion pattern on the target in the conventional deposition system of FIG. 1A.
Figure 2A:
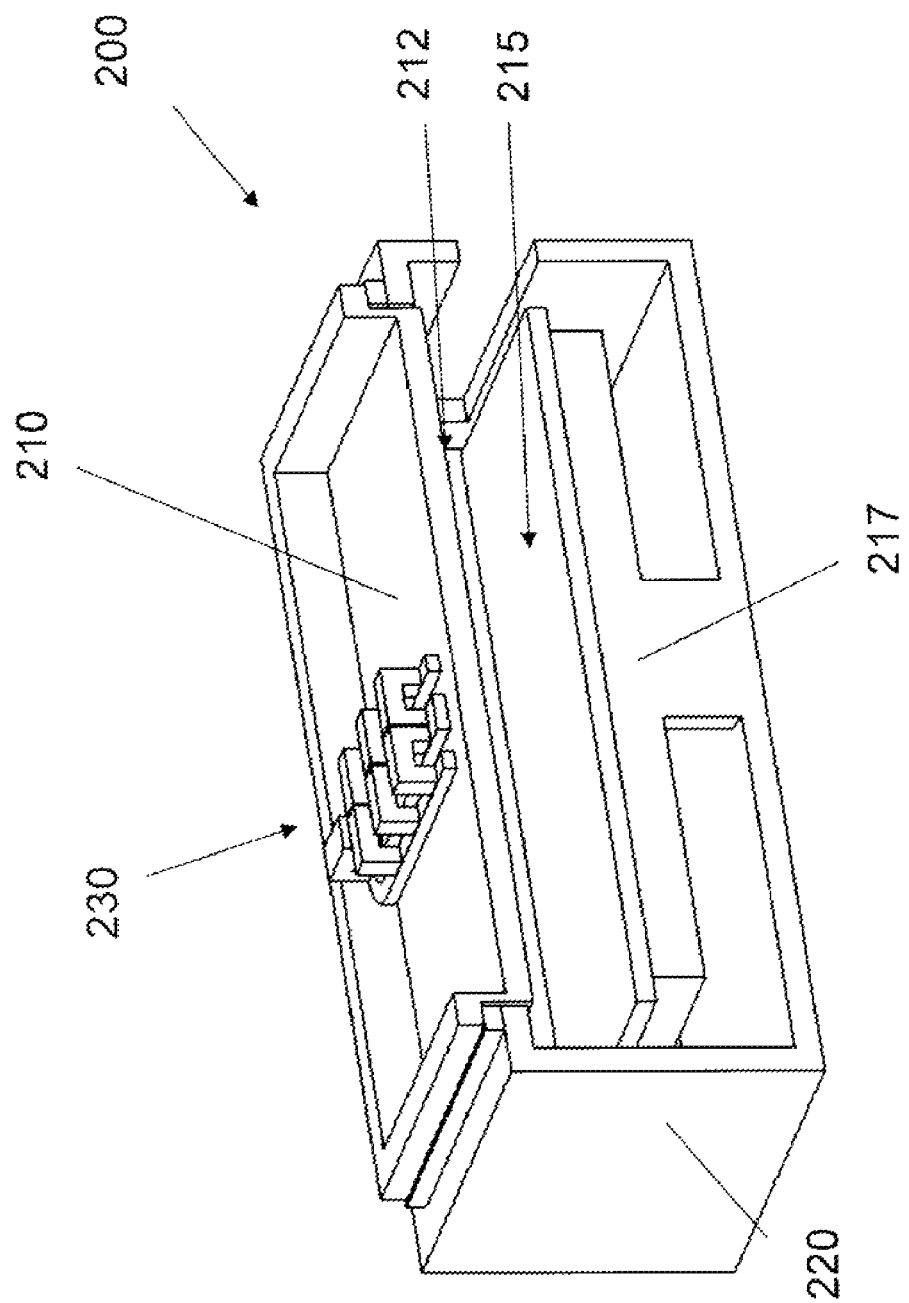
FIG. 2A illustrates a cross section of another conventional deposition system.
Figure 2B:
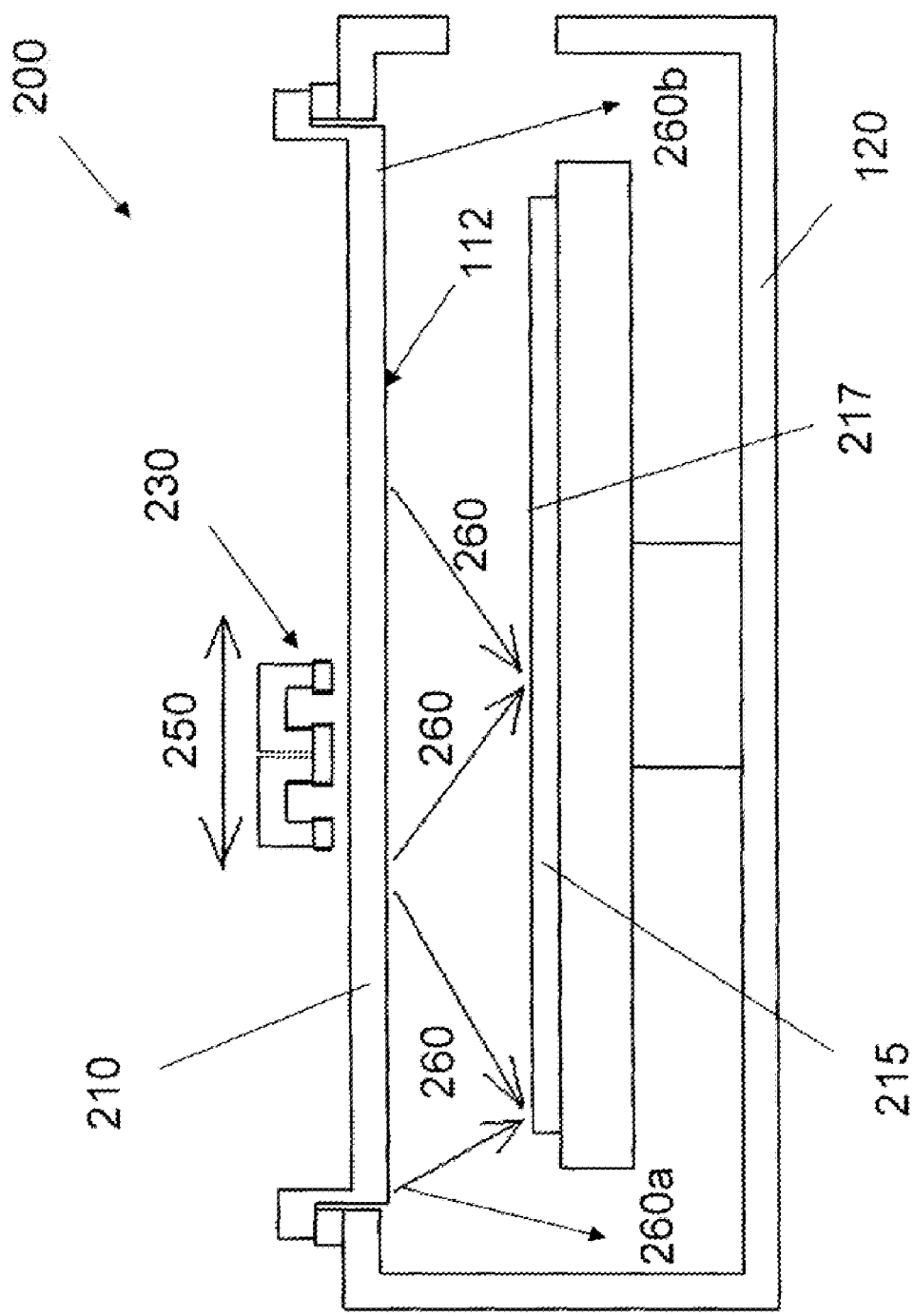
FIG. 2B is a cross-sectional view of the conventional deposition system of FIG. 2A.

A processing system 300, referring to FIGS. 3A-3E, includes a chamber 320 that can be sealed to create a vacuum environment in a space 350. The processing system 300 can include a sputtering deposition system or other types of processing stations as described below. The chamber 320 can include one or more inner chamber walls 321a-321c, one or more outer chamber walls 325a-325c, and end chamber walls 323 and 324. The inner chamber walls 321a-321c and the outer chamber walls 325a-325c can form one or more pairs of opposing chamber walls.

A plurality of substrates 315a-315c can be respectively positioned on the outer chamber walls 325a-325c. A plurality of targets 310a-310c can be respectively held on the inner chamber walls 321a-321c. Each target 310a, 310b, or 310c includes a sputtering surface 312 facing the space 350. Each substrate 315a, 315b, or 315c includes a deposition surface 317 facing the space 350 and opposing a sputtering surface 312 on the respective target 310a, 310b, or 310c. The sputtering surfaces 312 can be substantially planar. The deposition surfaces 317 can be substantially planar. The targets 310a-310c and the substrate 315a, 315b, or 315c can be arranged such that the sputtering surfaces 312 can be substantially parallel to the deposition surfaces 317 on the substrates 315a, 315b, or 315c when viewed from top.

Figure 12A:
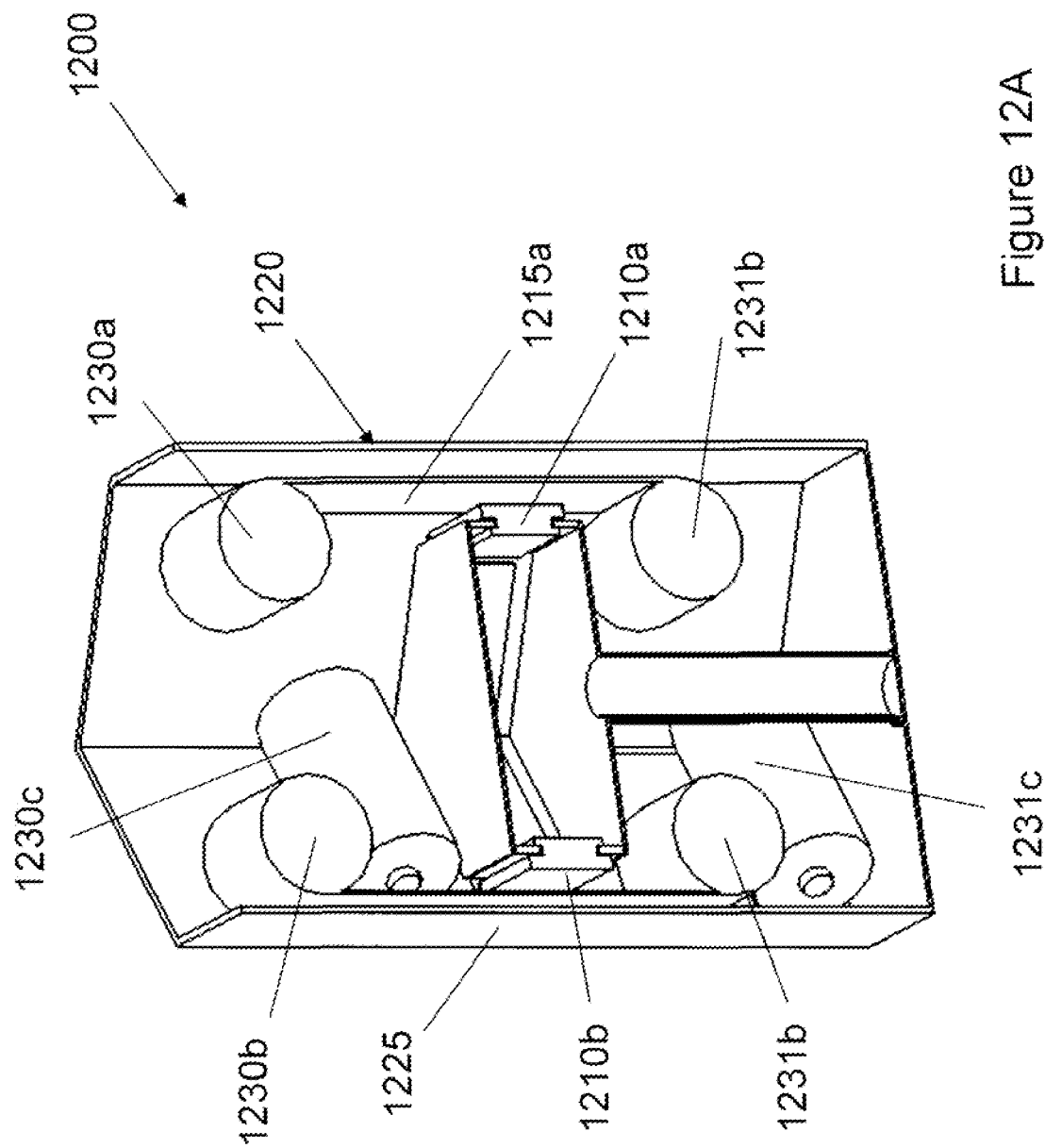
FIG. 12A is a perspective partial view of another processing system in accordance with the present specification.
Figure 12B:
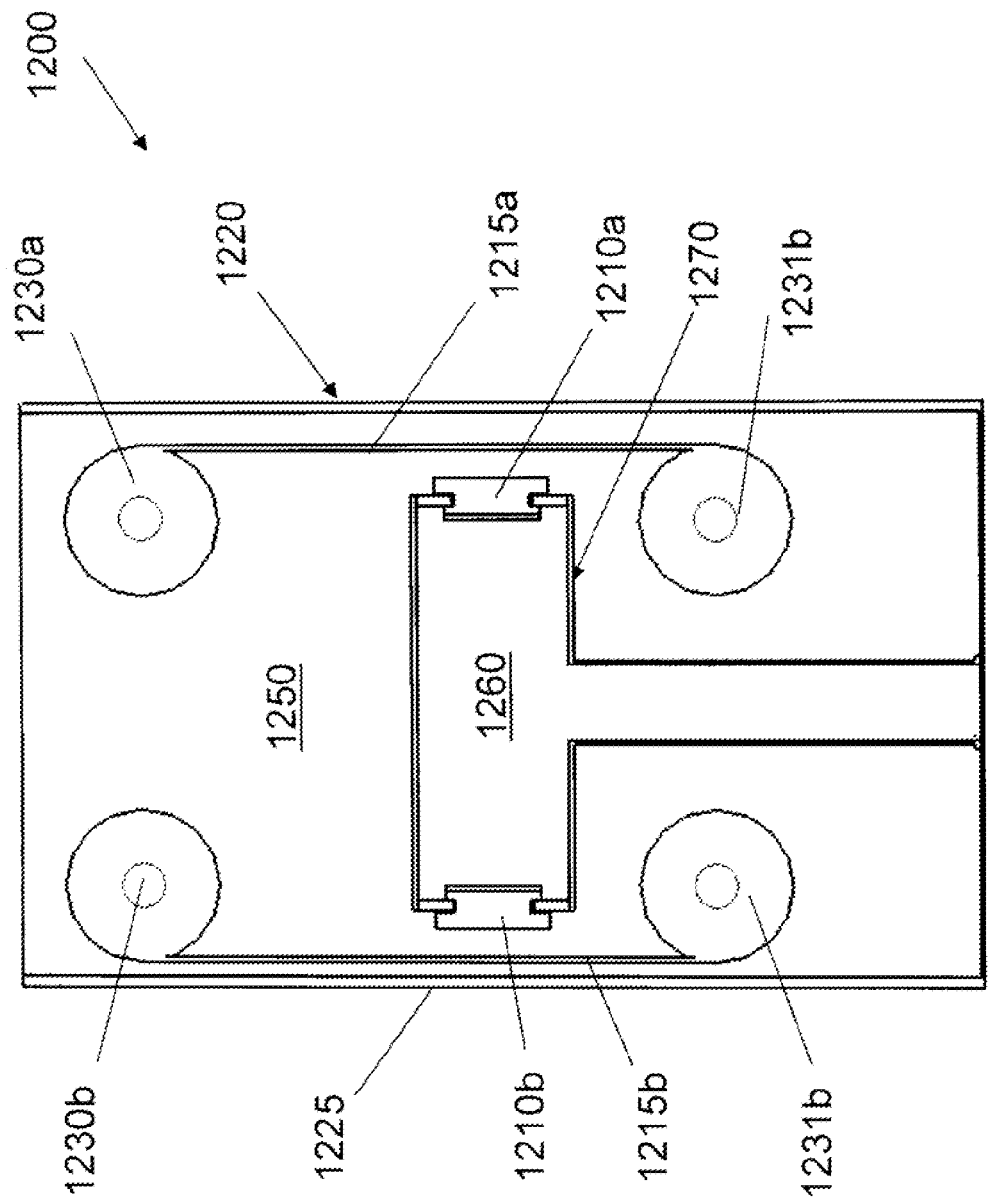
FIG. 12B is a cross-sectional view of the processing system of FIG. 12A.
Figure 13:
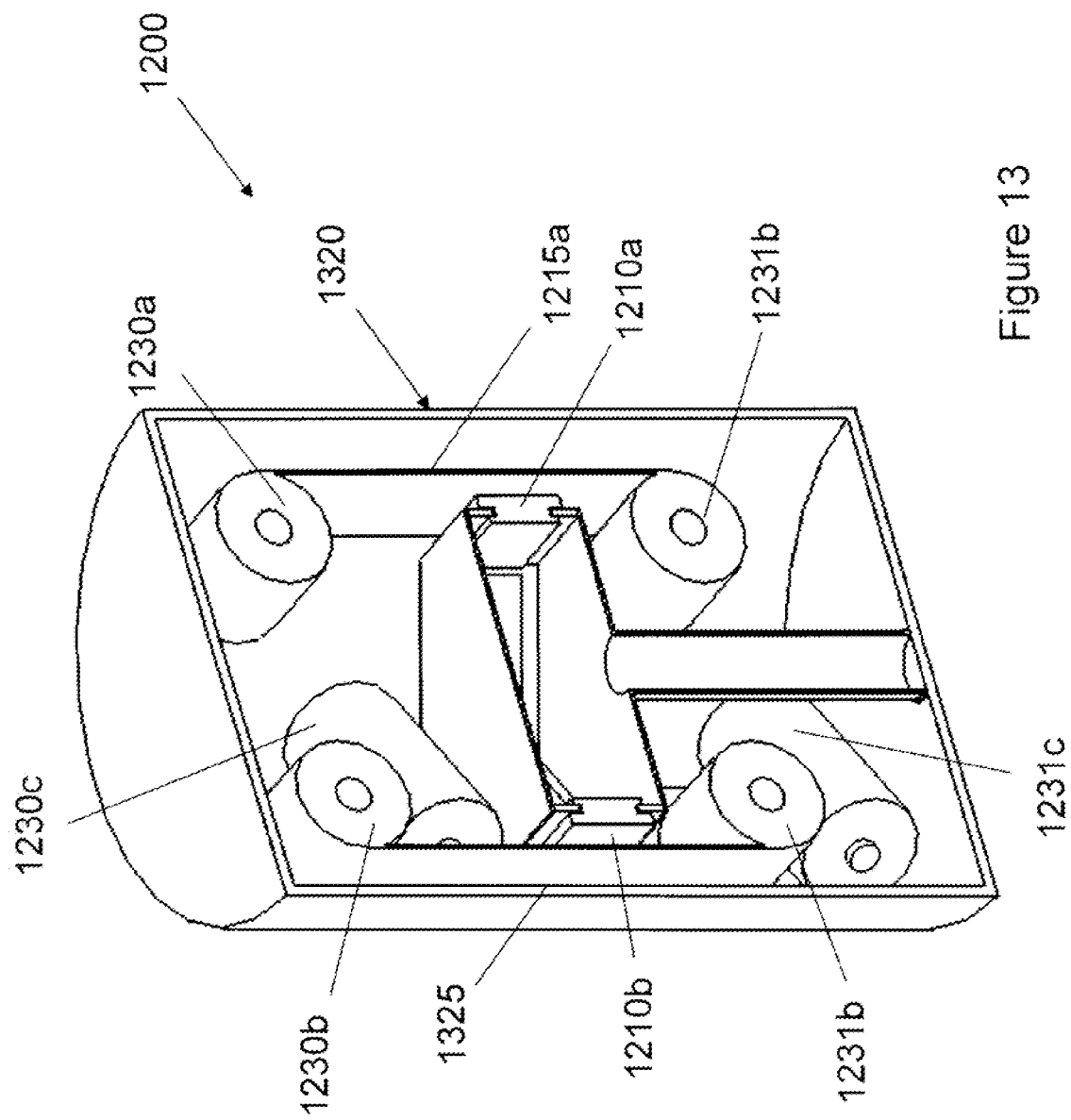
FIG. 13 is a perspective partial view of another processing system in accordance with the present specification.

The substrates 315a-315c can include a rigid substrate such as a circular or rectangular semiconductor wafer, a glass or ceramic panel, a metal plate, or a flexible sheet that can be mounted on a drive roller and a feed roller (as shown in FIGS. 12A, 12B, and 13). The substrates 315a-315c can also include several smaller substrates mounted on the solid plates. The targets 310a-310c can include copper backing plate, aluminum alloys backing plate, stainless steel backing plate, titanium alloy backing plate, other backing plate, aluminum (Al), aluminum zinc (AlZn), aluminum zinc oxide (AlZnO), aluminum oxide (Al2O3), aluminum nitride (AlN), aluminum copper (AlCu), aluminum silicon (AlSi), aluminum silicon copper (AlCuSi), aluminum fluoride (AlF), antimony (Sb), antimony telluride (SbTe), barium (Ba), barium titanate (BaTiO), barium fluoride (BaF), barium oxide (BaO), barium strontium titanate (BaSrTiO), barium calcium cuprate (BaCaCuO), bismuth (Bi), bismuth oxide (BiO), bismuth selenide (BiSe), bismuth telluride (BiTe), bismuth titanate (BiTiO), boron (B), boron nitride (BN), boron carbide (BC), cadmium (Cd), cadmium chloride (CdCl), cadmium selenide (CdSe), cadmium sulfide (CdS), CdSO, cadmium telluride (CdTe), CdTeHg, CdTeMn, cadmium stannate (CdSnO), carbon (C), cerium (Ce), cerium fluoride (CeF), cerium oxide (CeO), chromium (Cr), chromium oxide (CrO), chromium silicide (CrSi), cobalt (Co), copper (Cu), copper oxide (CuO), copper gallium (CuGa), CuIn, CuInSe, CuInS, CuInGa, CuInGaSe (CIGS), CuInGaS, Dy, Er, ErBaCuO, Eu, Gd, Ge, GeSi, Au, Hf, HfC, Hfn, Ho, In, InO, InSnO (ITO), Ir, Fe, FeO, La, LaAlO, LaNiO, LaB, LaO, Pb, PbO, ObTe, PbTiO3, PbZrO, PbZrTiO (PZT), LiNbO, Mg, MgF, MgO, Mn, MnO, Mo, MoC, MoSi, MoO, MoSe, MoS, Nd, NdGaO, Ni, NiCr, NiFe, NiO, NiV, Nb, NbC, NbN, NbO, NeSe, NbSi, NbSn, Pd, NiFeMoMn (permalloy), Pt, Pr, PrCaMnO (PCMO), Re, Rh, Ru, Sm, SmO, Se, Si, SiO, SiN, SiC, SiGe, Ag, Sr, SrO, SrTiO (STO), Ta, TaO, TaN, TaC, TaSe, TaSi, Te, Tb, Tl, Tm, Sn, SnO, SnOF (SnO:tF), Ti, TiB, TiC, TiO, TiSi, TiN, TiON, W, WC, WO, WSi, WS, W—Ti, V, VC, VO, Yb, YbO, Y, YbaCuO, YO, Zn, ZnO, ZnAlO (ZAO), ZnAl, ZnSn, ZnSnO, ZnSe, ZnS, ZnTe, Zr, ZrC, ZrN, ZrO, ZrYO (YSZ), and other solid element or compound.

Each inner chamber wall 321a-321c can hold one or more targets. In some embodiments, the targets 310a, 310b, or 310c on an inner chamber wall 321a-321c can include different target materials such that a mixture of materials from different targets 310a-310c can be deposited on a substrate 315a, 315b, or 315c to achieve a desired material composition in the deposited material on the deposition surface 317.

The lateral dimension of each target 310a, 310b, or 310c can be smaller than its respective opposing substrate 315a, 315b, or 315c. The targets 310a-310c can be fixed to the inner chamber walls 321a-321c, or have relative motion to the substrates during deposition. The vertical dimensions of the targets 310a-310c can be substantially smaller than the vertical dimensions of the substrates 315a-315c. The complexity and cost of the targets are thus significantly reduced. The processing system 300 can include a transport mechanism 370 that can move each of the substrates 315a-315c in the direction 375 along the outer chamber walls 325a-325c. In some embodiments, the targets 310a-310c can be moved in the direction 375 by a transport mechanism.

The direction 375 can be defined as the "vertical" direction for the ease of describing different direction of the processing system. The directions perpendicular to the vertical direction can be defined as the "horizontal" directions. The terms "horizontal" and "vertical" are used to describe the configurations of the processing system. The disclosed system is compatible with many other orientations.

Figure 3A:
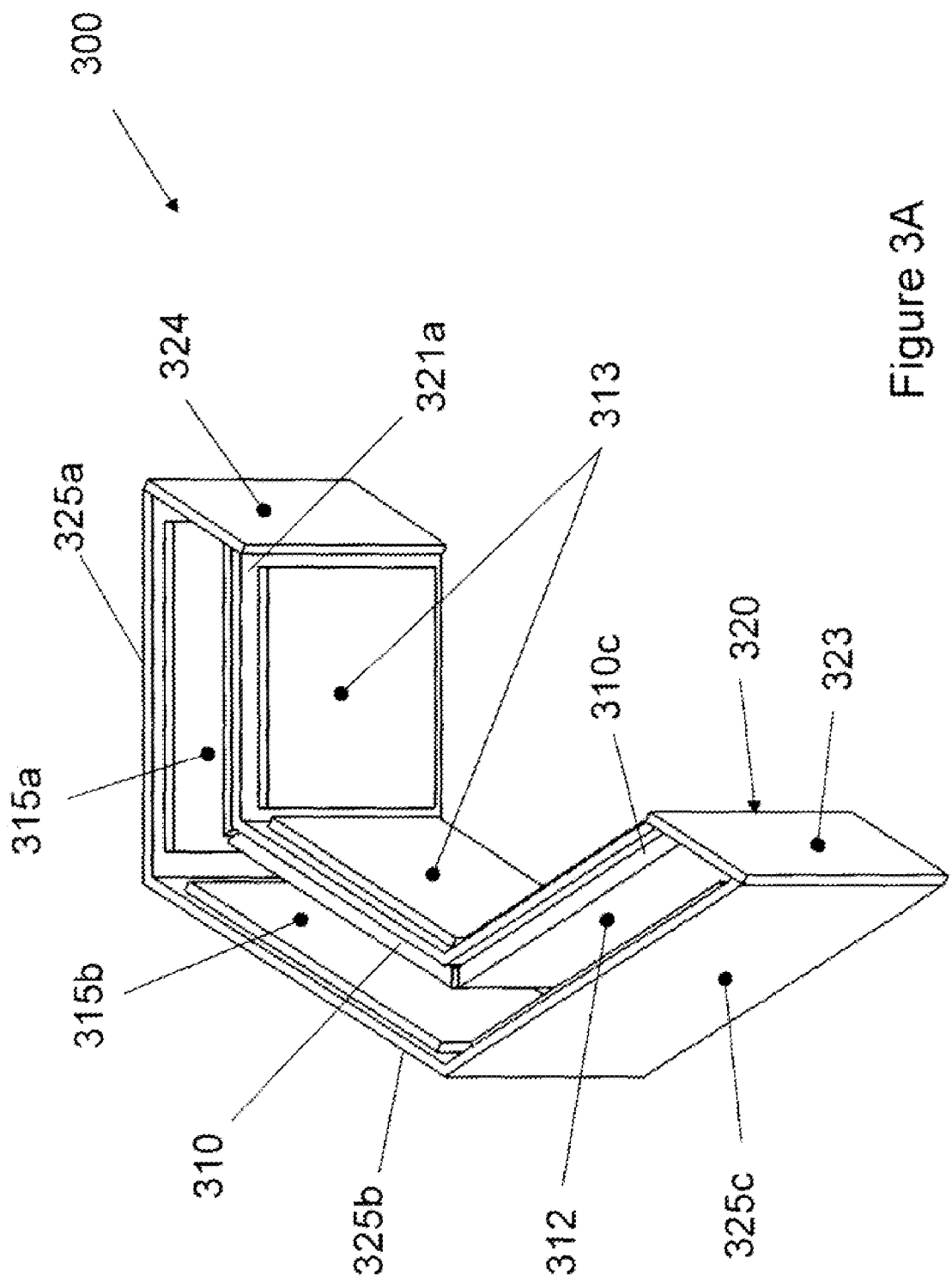
FIG. 3A is a perspective view of a deposition system in accordance with the present specification.
Figure 3B:
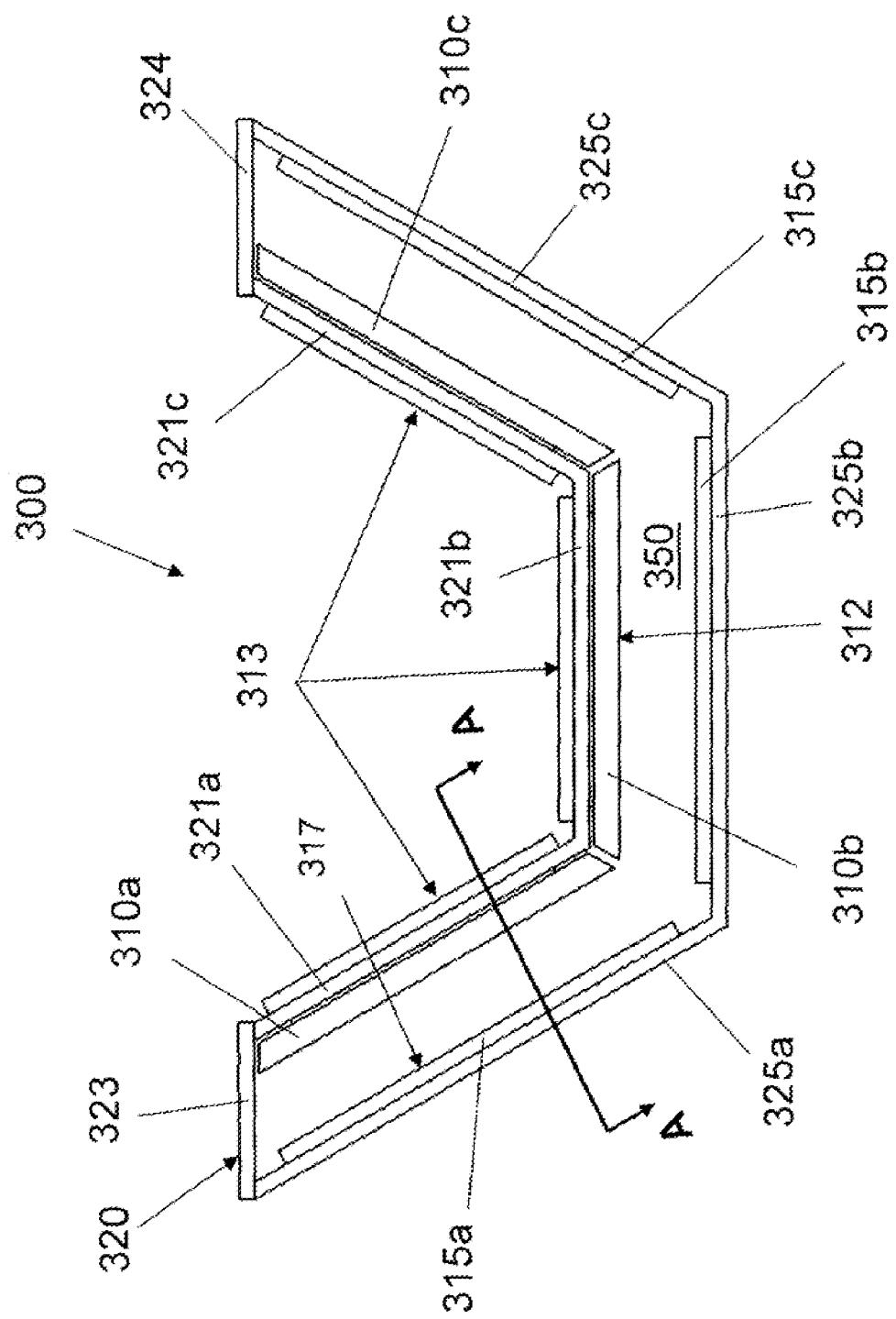
FIG. 3B is a top view of the processing system of FIG. 3A.

In the top view in FIG. 3B, that is, when viewed in the direction 375, the targets 310a, 310b, and 310c are sequentially positioned in a center region. At least one of the targets 310a, 310b, and 310c includes a sputtering surface 312 facing outward. A plurality of substrates 315a, 315b, 315c in the chamber are sequentially positioned in the top view of FIG. 3B. At least one of substrates 315a, 315b, and 315c includes a deposition surface 317 facing the center region. The deposition surface 317 can receive material sputtered off the sputtering surface 312. Different portions of the deposition surface 317 on the substrates 315a, 315b, or 315c can thus be scanned in front of its opposing target 310a, 310b, or 310c to allow target material sputtered off the sputtering surfaces 312 to be uniformly deposited on the deposition surfaces 317. If the position of a substrate 315a-315c is fixed relative to the target, the vertical dimension of the target needs to be comparable or larger than the substrate vertical dimension to achieve uniform deposition. In addition, each substrate 315a, 315b, or 315c can be made of multiple pieces of smaller substrates.

The processing system 300 can include backing plates 313 that are mounted on the surfaces of the inner chamber walls 321a, 322a, and 323a opposite to space 350 in the chamber 320. One or more magnetrons 330 can be mounted on individual backing plates 313. Each magnetron source 330 is positioned on an inner chamber wall 321a-321c and behind a target 310a, 310b, or 310c. Each magnetron source 330 can include an RF and/or DC power supply and one or more magnets for producing magnetic fields and confining free electrons at the sputtering surface 312. They can be electrically connected or separated from each other, but all are electrically isolated from the body of the chamber 320.

The processing system 300 is also compatible with DC or RF diode sputter deposition wherein the processing system does not require a magnetron. Negative DC or RF bias can be applied to the sputtering target. A plasma gas can form at above a target threshold voltage and with sufficient gas pressure in the deposition chamber.

Figure 3C:
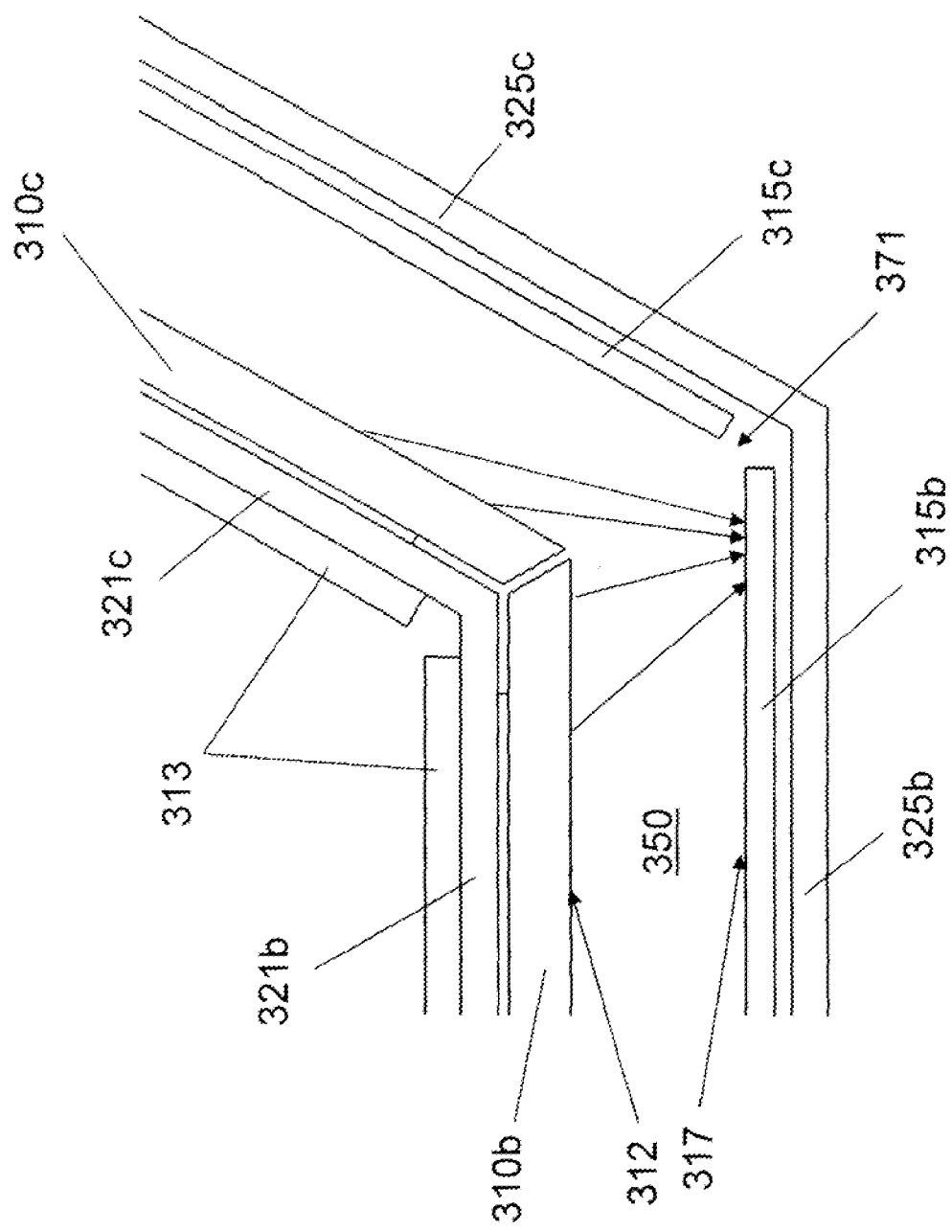
FIG. 3C is an expanded top view of the processing system of FIG. 3A.
Figure 3D:
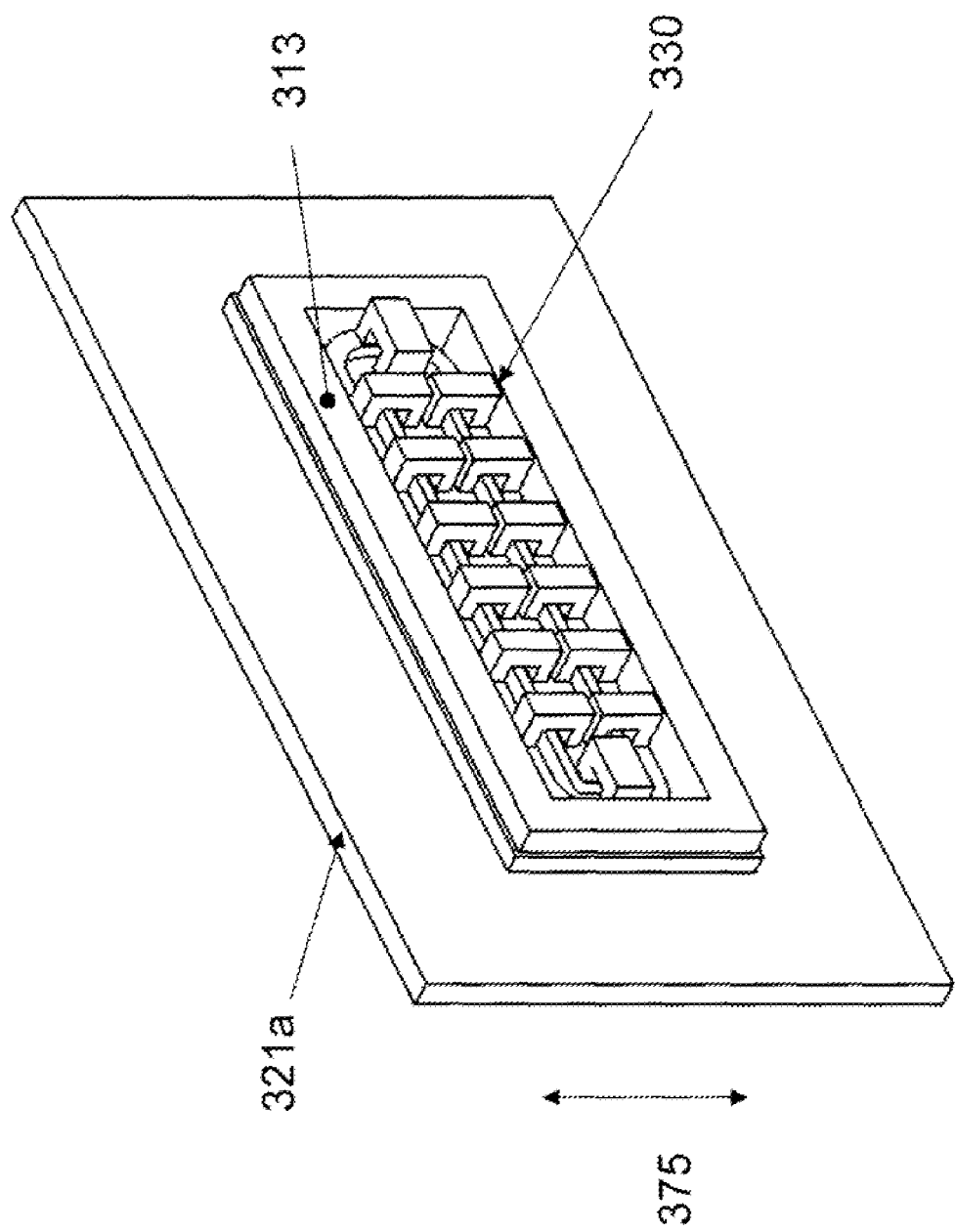
FIG. 3D is an exemplified magnetron source compatible with the processing system of FIG. 3A.
Figure 3E:
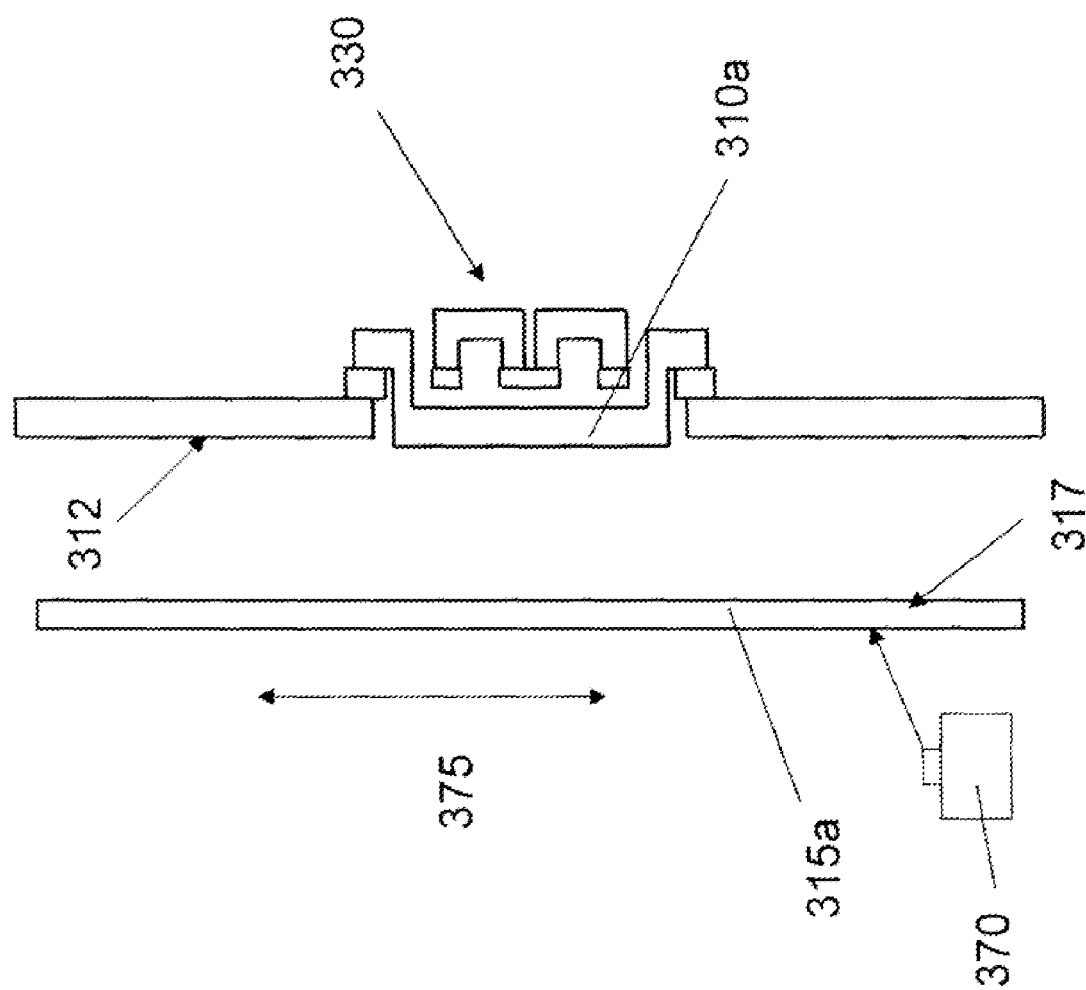
FIG. 3E is a cross-sectional partial view of the processing system along the line A-A in FIG. 3B.

One advantage of the processing system 300 is the improved deposition uniformity, especially near the edges of the substrate. Referring to FIG. 3C, targets 310b and 310c can be positioned close or in contact with each other at their edges. The area of the deposition surface 317 on the substrate 315b and near the edge 371 can receive target materials sputtered off both target 310b and 310c, which can overcome a problem of reduced deposition near the edges of the substrates in some conventional system.

Another advantage of the processing system 300 is improved target utilization. The targets are centrally located and are surrounded by larger substrates. The adjacent substrates 315b and 315c can be positioned close to or in touch with each other such that almost all the materials sputtered off the target 310a-310c can be collected by substrates 315a-315c. The target utilization is therefore increased.

Figure 4A:
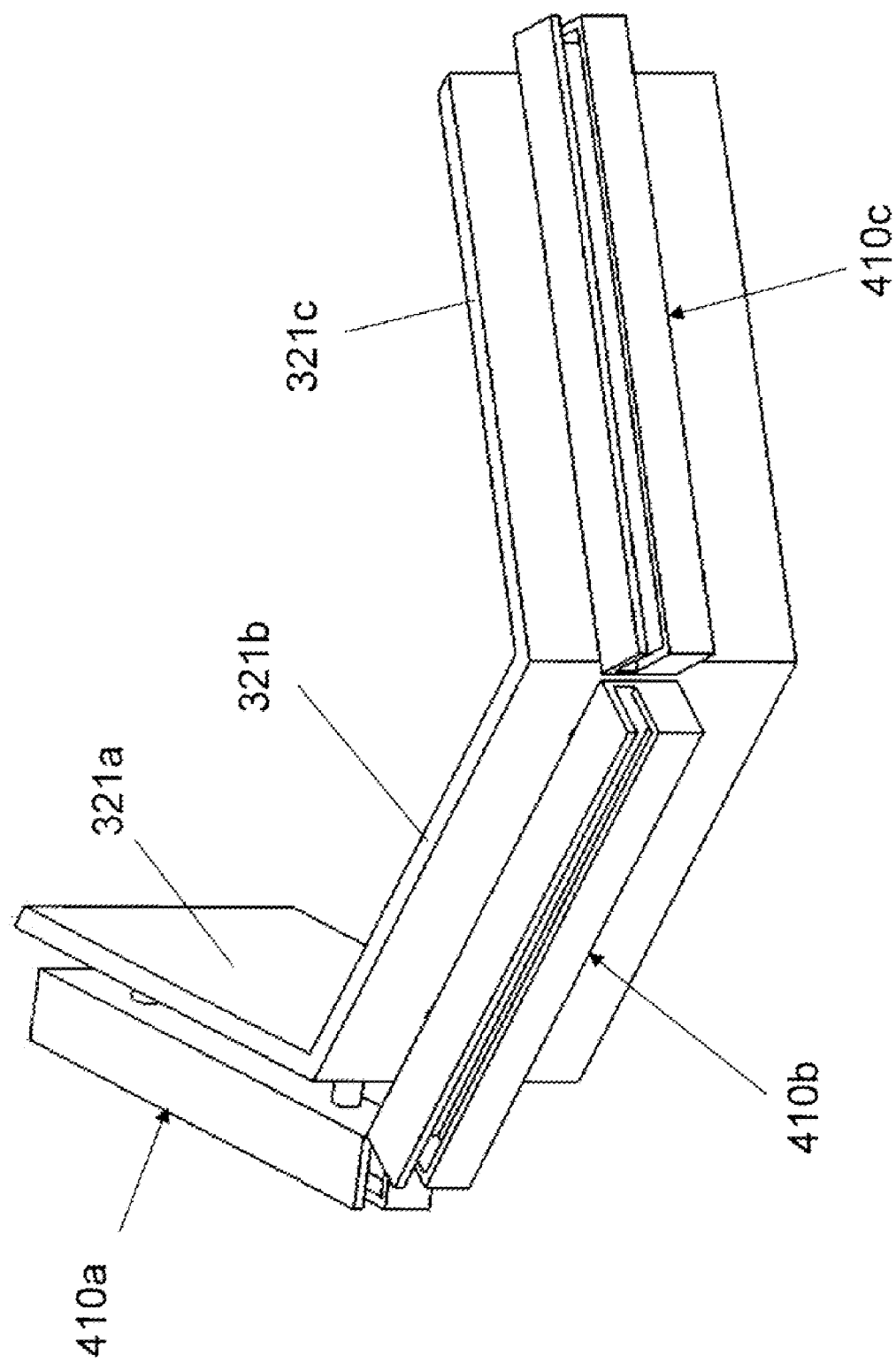
FIG. 4A is perspective view of an exemplified thermal evaporation or sublimation source compatible with the processing system of FIG. 3A.
Figure 4C:
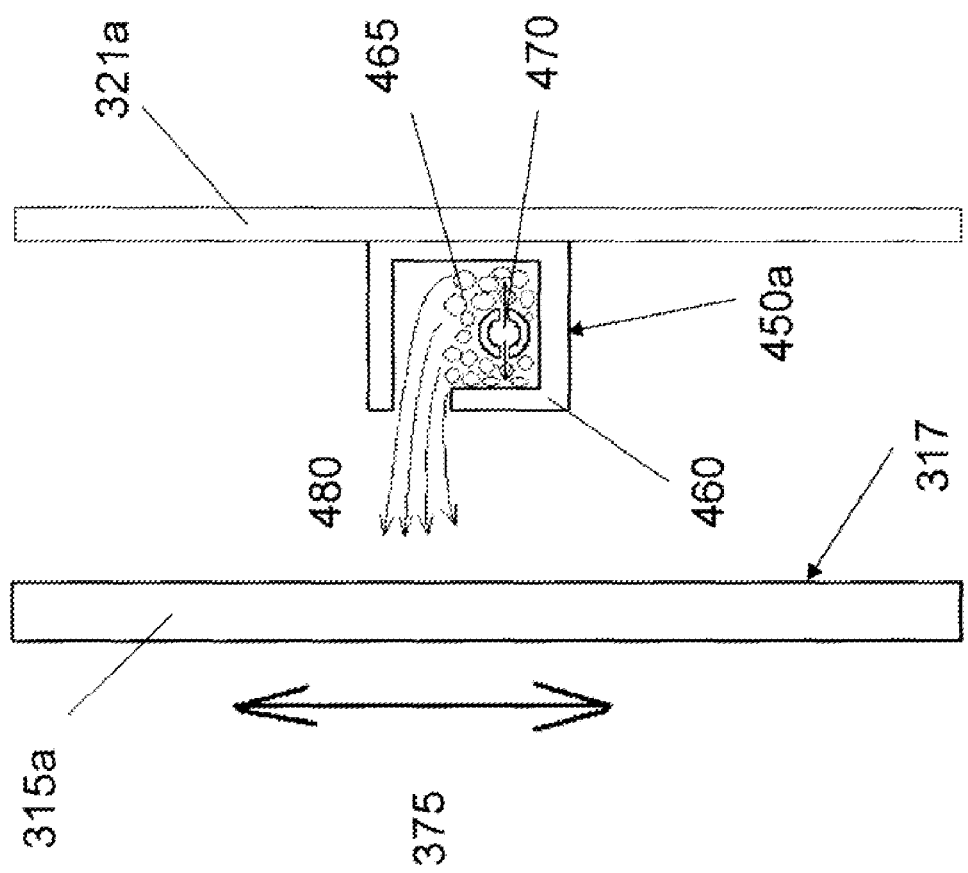
FIG. 4C is cross-sectional view of an exemplified thermal sublimation source of FIG. 4A.

In some embodiments, the targets can be so arranged to form a portion or a whole of an inner polygon, such as half of a hexagon as shown in FIGS. 3A-3C, or a whole hexagon as shown in FIGS. 4A-4C. The substrates can form a portion of an outer polygon, such as half of a hexagon. The outer polygon and the inner hexagon can but not necessarily share the same center location. In the present specification, the term "polygon" refers to a closed planar path composed of a finite number of sequential line segments. Furthermore, "polygon" used in the present specification is limited to a simple polygon that has a single, non-intersecting boundary. The line segments may have equal lengths or different lengths.

It should be noted that the targets and the substrates can be arranged in other configurations in the disclosed processing system. For example, the processing system can include two, four, five, six or more pairs of opposing targets and substrates instead of three pairs. The opposing sputtering surfaces on the targets and deposition surfaces on the substrates can be substantially parallel or tilted relative to each other. In a top view, the inner and outer chamber walls can take different shapes such as three or more sides of a polygon, for example, rectangle, a pentagon, a hexagon, or an octagon. The widths of the inner or outer chamber walls may be equal or different from each other. The inner and outer chamber walls can also be in cylindrical shape.

In addition to sputtering deposition, the processing system 300 is compatible with other deposition methods such as thermal evaporation deposition, thermal sublimation deposition, chemical vapor deposition (CVD), ion beam, and etch source depositions. Referring to FIG. 4A, thermal evaporation or thermal sublimation sources $410a$-$410c$ can be positioned on the inner chamber walls $321a$-$321c$. Referring to FIG. 4B, a thermal evaporation source $410a$ can be held on an inner chamber wall $321a$. The thermal evaporation source $410a$ can include an evaporation boat 420 containing evaporation material 425 that can be heated to near or above the melting temperature. The evaporation vapor 430 can exit from an opening in the evaporation boat 420 and to deposit on the deposition surface 317 on the substrate $315a$. The substrate 315 can be moved by a transport mechanism along the direction 375 so that different areas on the deposition surface 317 can receive the evaporation material. Referring to FIG. 4C, an exemplified thermal sublimation source $450a$ can be held on an inner chamber wall $321a$. The thermal sublimation source $450a$ can also include an evaporation boat 460 containing sublimation material 465 that is in solid phase (e.g. solid particles) at room temperature. The sublimation material 465 can be heated by a heater 470 to near or above the sublimation temperature to evaporate from a solid phase directly into vapor phase. The evaporation vapor 480 can exit from an opening in the evaporation boat 450 and to deposit on the deposition surface 317 on the substrate $315a$. The substrate 315 can be moved by a transport mechanism along the direction 375 so that different areas on the deposition surface 317 can receive the sublimed material. The thermal sublimation can also be enhanced by a carrier gas flown over the solid sublimation material.

Figure 5A:
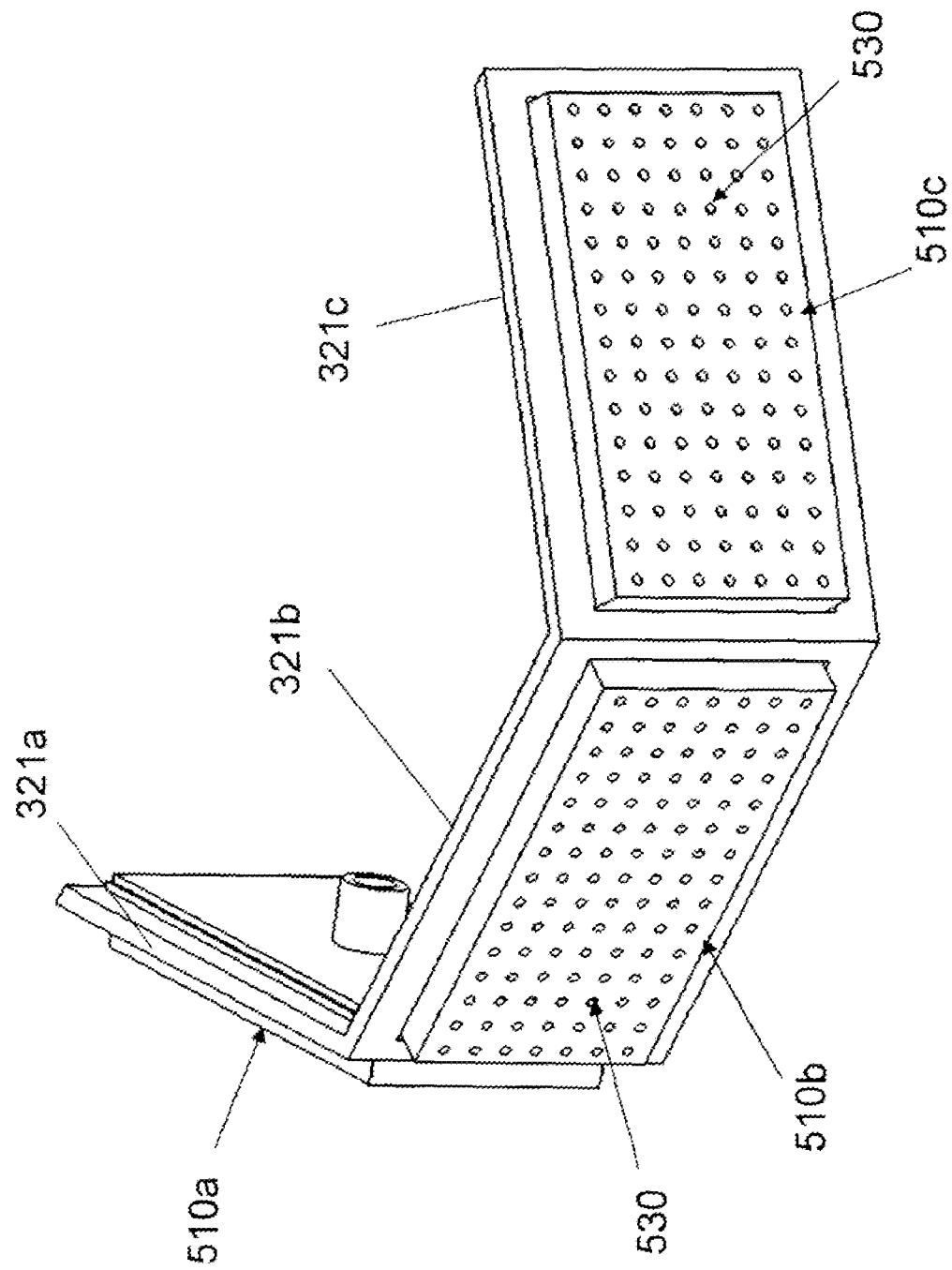
FIG. 5A is perspective view of an exemplified source for chemical vapor deposition (CVD) or plasma enhanced chemical vapor deposition (PECVD) compatible with the processing system of FIG. 3A.
Figure 5B:
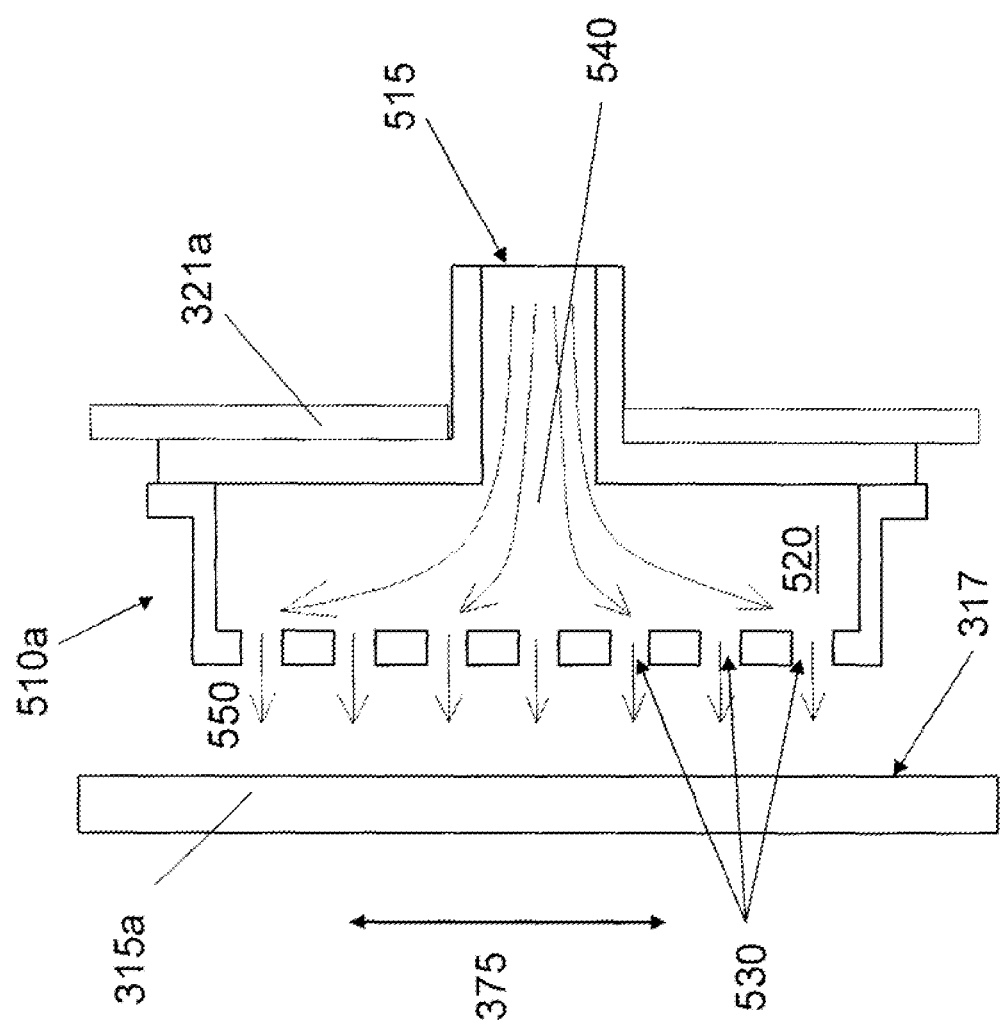
FIG. 5B is cross-sectional view of an exemplified CVD source of FIG. 5A.

Referring to FIGS. 5A and 5B, exemplified sources $510a$-$510c$ for chemical vapor deposition (CVD) or plasma enhanced chemical vapor deposition (PECVD) can be positioned on the inner chamber walls $321a$-$321c$. Individual sources $510a$-$510c$ can each include a chamber 520 that includes an inlet 515 and a plurality of outlet holes 530. The outlets 530 can be positioned close to the substrate $315a$-$315c$. Precursor gases are fed through inlet 515 into the chamber 520 and blown to the substrate $315a$-$315c$. The precursor gases can break up due to thermal or ionizing energy and recombine to form a film on the substrate $315a$-$315c$. The density and sizes of the outlets 530 can be controlled to allow uniform deposition on the substrate $315a$-$315c$. The substrate $315a$-$315c$ can be moved by a transport mechanism to allow uniform deposition across the deposition surface 317. In some embodiments, the sources $510a$-$510c$ can be moved relative to substrates $315a$-$315c$. If the substrate position is fixed relative to the deposition source, the deposition source vertical dimension needs to be comparable or larger than the substrate vertical dimension.

For PECVD, an alternative current (AC) or radio frequency (RF) power is applied within the chamber 520 and/or between the outlets 530 and the substrate $315a$-$315c$. The breaking up of the precursor gas molecules can be caused by collisions with electrons, radicals, or ions (i.e. in a plasma) by the AC and RF power in addition to thermal energy.

In some embodiments, an ion source can be used in place of the CVD source $510a$-$510c$ to allow etching of the substrate instead of deposition on the substrate. When a proper voltage bias is applied to the substrate in a plasma environment and the chamber pressure is sufficiently low, ions can bombard the substrate. The ion bombardment can etch the substrate either by physical collision in the case of sputter etch, by reactive ions and radicals in the plasma in the case of plasma etch, or by combination of physical bombardment and chemical etch in the case of reactive ion etch (RIE). Moreover, an ion source can also be used in conjunction with a CVD source to assist the break up of precursor gas molecules.

Figure 6A:
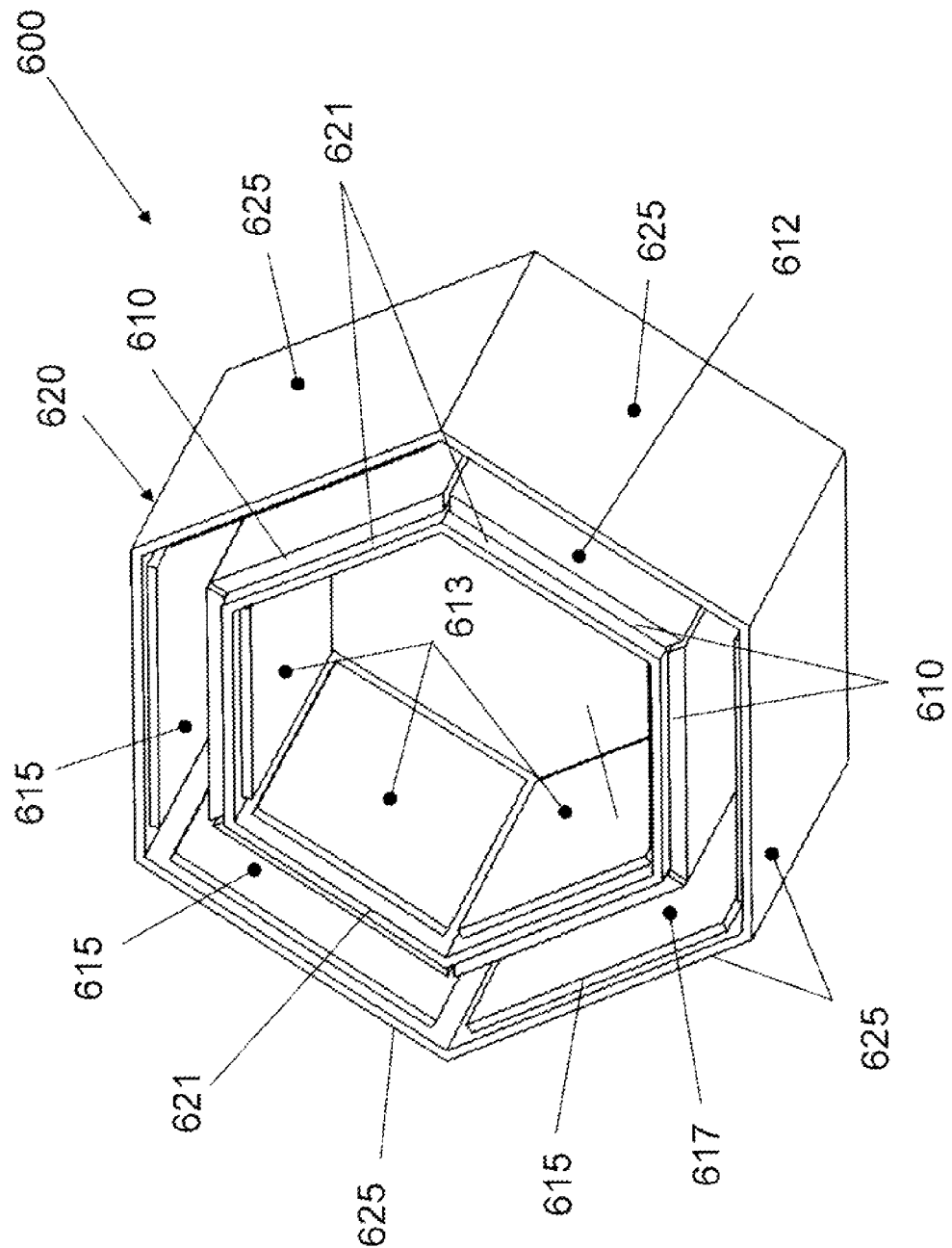
FIG. 6A is a perspective view of another processing system in accordance with the present specification.

A processing system 600, referring to FIGS. 6A-6C, can include a enclosed chamber 620 that includes six sequentially connected inner chamber walls 621 and six sequentially connected outer chamber walls 625. The processing system 600 can include a sputtering deposition system or other types of processing stations as described below. The outer chamber walls 625 form a large six-sided enclosure outside of the small enclosure. The space between the small enclosure and the large enclosure defines a space 650 that is the interior of the chamber 620. The chamber 620 can further include a lower wall 640 and an upper wall 641 to seal the space 650. A vacuum environment can be created in the space 650 for sputtering deposition. A space 660 defined by the inner chamber walls 621 can be outside of the vacuum environment.

The inner chamber walls 621 and the outer chamber walls 625 can be aligned substantially along a direction 675, which can be defined as the vertical direction. In a top view (FIG. 6B), the cross section of the inner chamber walls 621 can form a small hexagon in a horizontal plane. The outer chamber walls 625 can form a larger hexagon outside of the small hexagon. The large hexagon and the small hexagon can but not necessarily share the same center location. The inner chamber walls 621 and the outer chamber walls 625 can form six pairs of opposing chamber walls that are substantially parallel to each other.

It should be noted that the processing system can be compatible with other configurations. For example, instead of six pairs of opposing chamber walls, the processing system can include other number of pairs (e.g. four, five, seven, eight, or more pairs) of opposing inner and outer chamber walls. The inner chamber walls or the outer chamber walls can be of the same or different widths. In a top view, the inner chamber walls may form a small polygon. The outer chamber walls may form a large polygon. The small and the large polygons can but not necessarily share the same center location. When viewed from the top, the chamber walls may have equal width or different widths. The inner or outer or both chamber walls can also be cylindrically shaped.

A plurality of substrates 615 can be held on the outer chamber walls 625. A plurality of targets 610 can be held on the inner chamber walls 621. The substrates 615 and the targets 610 can be positioned within the chamber 620 and have surfaces facing the space 650 that can be evacuated to a vacuum environment. Each target 610 includes a sputtering surface 612 opposing a deposition surface 617 on a substrate 615. The sputtering surface 612 can be substantially flat and parallel to the vertical direction. The sputtering surface 612 can also have other shapes such as a curved surface, or a surface not parallel to the direction 675 (which can be defined as the vertical direction). The sputtering surfaces 312 can be substantially planar. The deposition surfaces 317 can be substantially planar.

The target 610 and the substrate 615 can be respectively held on opposing inner chamber wall 621 and outer chamber wall 625. The targets 610 and the substrate 615 can be arranged such that the sputtering surface 612 is substantially parallel to the deposition surfaces 617 in at least lateral dimension. The outer walls 625 can form an enclosure surrounding the substrates 615 and the targets 610.

The substrates 615 can include a rigid substrate such as a circular or rectangular semiconductor wafer, a glass panel, a metal plate, or a flexible sheet that can be mounted on a drive roller and a feed roller. The substrates 315a-315c can include one or more smaller substrates mounted on the solid plates. The targets 310a-310c can include copper backing plate, aluminum alloys backing plate, stainless steel backing plate, titanium alloy backing plate, other backing plate, aluminum (Al), aluminum zinc (AlZn), aluminum zinc oxide (AlZnO), aluminum oxide (Al2O3), aluminum nitride (AlN), aluminum copper (AlCu), aluminum silicon (AlSi), aluminum silicon copper (AlCuSi), aluminum fluoride (AlF), antimony (Sb), antimony telluride (SbTe), barium (Ba), barium titanate (BaTiO), barium fluoride (BaF), barium oxide (BaO), barium strontium titanate (BaSrTiO), barium calcium cuprate (BaCaCuO), bismuth (Bi), bismuth oxide (BiO), bismuth selenide (BiSe), bismuth telluride (BiTe), bismuth titanate (BiTiO), boron (B), boron nitride (BN), boron carbide (BC), cadmium (Cd), cadmium chloride (CdCl), cadmium selenide (CdSe), cadmium sulfide (CdS), CdSO, cadmium telluride (CdTe), CdTeHg, CdTeMn, cadmium stannate (CdSnO), carbon (C), cerium (Ce), cerium fluoride (CeF), cerium oxide (CeO), chromium (Cr), chromium oxide (CrO), chromium silicide (CrSi), cobalt (Co), copper (Cu), copper oxide (CuO), copper gallium (CuGa), CuIn, CuInSe, CuInS, CuInGa, CuInGaSe (CIGS), CuInGaS, Dy, Er, ErBaCuO, Eu, Gd, Ge, GeSi, Au, Hf, HfC, Hfn, Ho, In, InO, InSnO (ITO), Ir, Fe, FeO, La, LaAlO, LaNiO, LaB, LaO, Pb, PbO, PbOTe, PbTiO3, PbZrO, PbZrTiO (PZT), LiNbO, Mg, MgF, MgO, Mn, MnO, Mo, MoC, MoSi, MoO, MoSe, MoS, Nd, NdGaO, Ni, NiCr, NiFe, NiO, NiV, Nb, NbC, NbN, NbO, NeSe, NbSi, NbSn, Pd, NiFeMoMn (permalloy), Pt, Pr, PrCaMnO (PCMO), Re, Rh, Ru, Sm, SmO, Se, Si, SiO, SiN, SiC, SiGe, Ag, Sr, SrO, SrTiO (STO), Ta, TaO, TaN, TaC, TaSe, TaSi, Te, Tb, Tl, Tm, Sn, SnO, Ti, TiB, TiC, TiO, TiSi, TiN, TiON, W, WC, WO, WSi, WS, W—Ti, V, VC, VO, Yb, YbO, Y, YbaCuO, YO, Zn, ZnO, ZnAlO, ZnAl, ZnSn, ZnSnO, ZnSe, ZnS, ZnTe, Zr, ZrC, ZrN, ZrO, ZrYO (YSZ), and other solid element or compound. Each inner chamber wall 621 can hold one or more targets. In some embodiments, the targets 610 on an inner chamber wall 610 can include different target materials such that a mixture of materials from different targets 610 can be deposited on the opposing substrate 615 or substrates adjacent to the opposing substrate 615. The material composition of the deposited material on the deposition surface 617 can thus be controlled. In some embodiments, the targets 610 can of the same sizes or different sizes. The substrates can be the same sizes or different sizes.

The lateral dimension of each target 610 can be similar or smaller than its opposing substrate 615. The targets 610 are fixed to the inner chamber walls 621. The vertical dimensions of the targets 610 can be substantially smaller than the vertical dimensions of the substrates 615, which can reduce target complexity and cost. The processing system 600 can include a transport mechanism 670 that can move each of the substrates 615 in the vertical direction 675 along the inner chamber walls 621. Different portions of the sputtering surface 617 on the substrates 615 can thus be scanned in front of its opposing target 610 to allow target material sputtered off the sputtering surfaces 612 to be uniformly deposited on the deposition surfaces 617. The targets 610 and inner chamber walls 621 can also be moved relative to the substrates 615 to achieve uniform deposition. If the substrate position is fixed relative to the deposition source, the deposition source vertical dimension needs to be comparable or larger than the substrate vertical dimension. In the top view in FIG. 6B (i.e. when viewed in the direction 675), the targets 610 are sequentially positioned in a center region. The targets 610 can form an inner close-loop. The adjacent targets 610 can include gaps in between. At least one of targets 610 includes a sputtering surface 612 facing outward. A plurality of substrates 615 in the chamber 620 are sequentially positioned in the top view of FIG. 6B. The adjacent substrates 615 in the sequence can have gaps in between. The substrates 615 can also form an outer close-loop outside of the inner close-loop. At least one of the substrates 615 includes a deposition surface 617 facing the center region. The deposition surface 617 can receive material sputtered off the sputtering surface 612.

The processing system 600 can include backing plates 613 mounted on the inner chamber walls 621. The backings plate 613 can be on the inside surface of the inner chamber walls 621 and outside of the space 650. Magnetron sources 630a and 630b can be mounted on the backing plates 613. At least portions of the magnetron sources 630a and 630b can be positioned in the space 660 and outside of the vacuum environment (in the space 650) during sputtering deposition. Each magnetron source 630a or 630b can include an RF and/or DC power supply and one or more magnets for producing magnetic fields and confirming free electrons at the sputtering surface 612. The magnetron sources 630a and 630b can be electrically connected with one control or separated with independent controls. The magnetron sources 630a and 630b can be electrically isolated from the chamber body.

In some embodiments, the adjacent targets 610 can be in contact or at close distance with each other to form a close loop. The gap between two adjacent targets 610 can be smaller than half the width of one of the two adjacent targets 610, wherein the width can be defined by the dimension along the inner chamber wall 621 in the horizontal direction (i.e. in the top view). In some embodiments, gap between two adjacent targets 610 can be smaller than one tenth of the width of one of the two adjacent targets 610. The magnetron sources 630a and 630b on the adjacent inner chamber walls 621 can be electrically or physically connected such that a hexagonal close-loop electron path can be formed over the sputtering surfaces 612 of the six targets 610. The magnetron sources 630a and 630b can share a common power supply or connect to different power supplies controlled separately. The chamber 620 can be at ground potential or positively biased. The targets 610 are insulated from the chamber 620 and held negative voltages. The movements of free electrons can thus be effectively confined by magnetic fields in a continuous close-loop electron path near the sputtering surfaces of the targets. Plasma ionization near the sputtering surfaces can therefore be enhanced.

Figure 7:
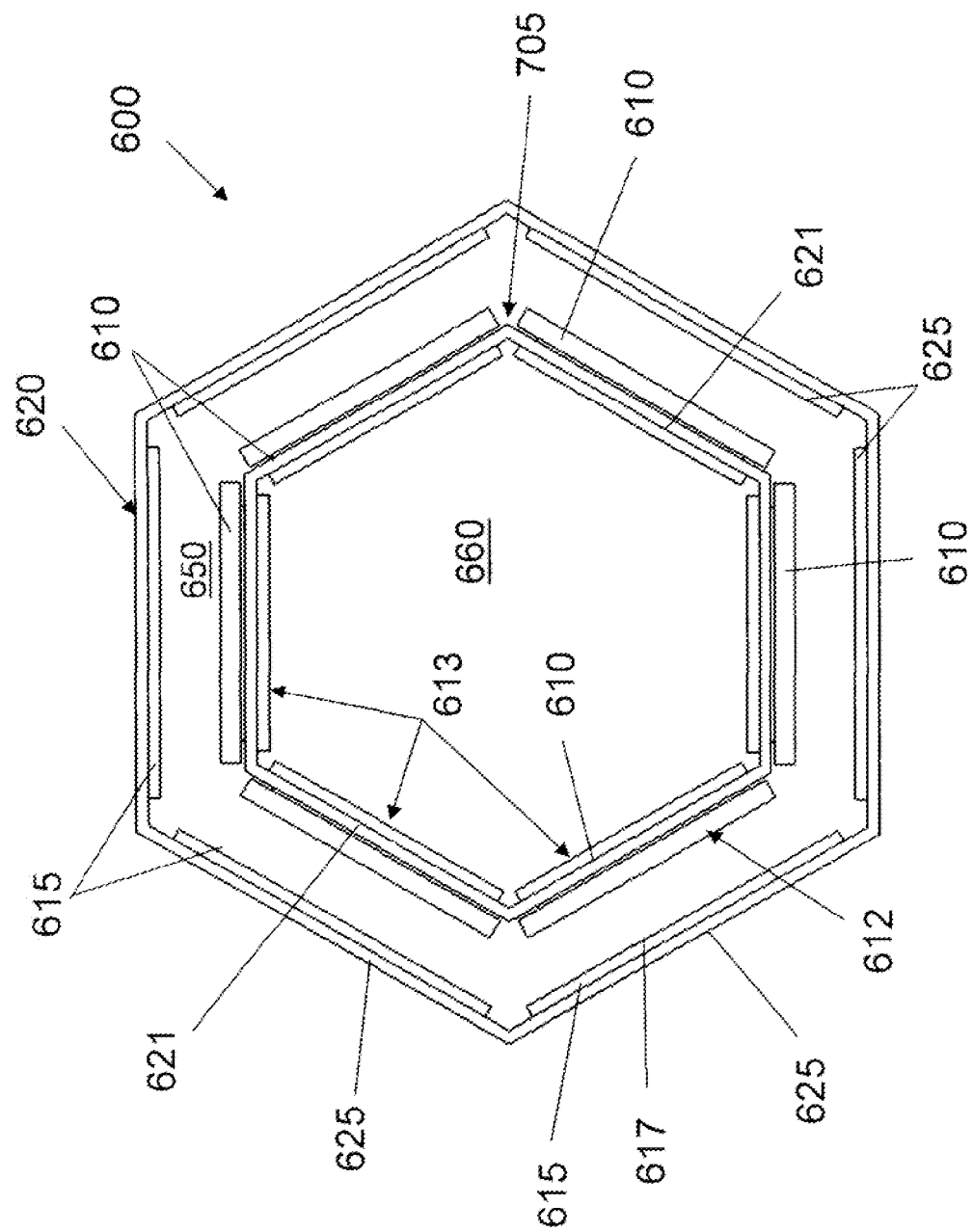
FIG. 7 is a top view of the processing system of FIG. 6A with the targets being separated by gaps.

The rates of sputtering off different targets 610 can be varied independently to allow deposition rates and uniformity to different substrate 615 to be easily adjusted. The deposition uniformity can also be adjusted by adjusting the magnetic strength at different locations of the targets 610 in a horizontal direction. For example, a stronger magnetic field near corner where two targets 610 meet can increase sputtering rate at that location and thus increase deposition rate near the edge of the substrate 615. In some embodiments, the targets 610 can be connected to form a unitary target around the space 660. In some embodiments, the targets 610 can be separated by gaps 705 as shown in FIG. 7.

One advantage of the processing system 600 is that the target utilization is improved. The deposition surfaces can be substantially larger than the sputtering surfaces. The targets can be smaller than the substrate in one or two dimensions while providing similar deposition rate compared to larger targets in the convention processing systems. The sputtering surfaces 612 of the targets are surrounded by the deposition surfaces 617 of the substrates. Thus the targets can be kept small, simple and less costly. The sputtered target materials can be more effectively collected by the deposition surfaces. Waste in target material is thus reduced. Moreover, the processing system 600 also provides more uniform deposition than conventional processing systems. Similar to the illustration in FIG. 3C, a substrate in the processing system 600 can receive sputtered materials from more than one target. Uniformity can thus be improved especially near the edge of the substrate. In addition, less power is required to deposit same amount of materials due to the smaller source surface area. Throughput can be improved by allowing multiple of substrates to be deposited simultaneously. The uniformity of deposition, especially near the edges of the substrates, is improved by multiple fluxes of deposition materials from multiple targets.

Figure 8A:
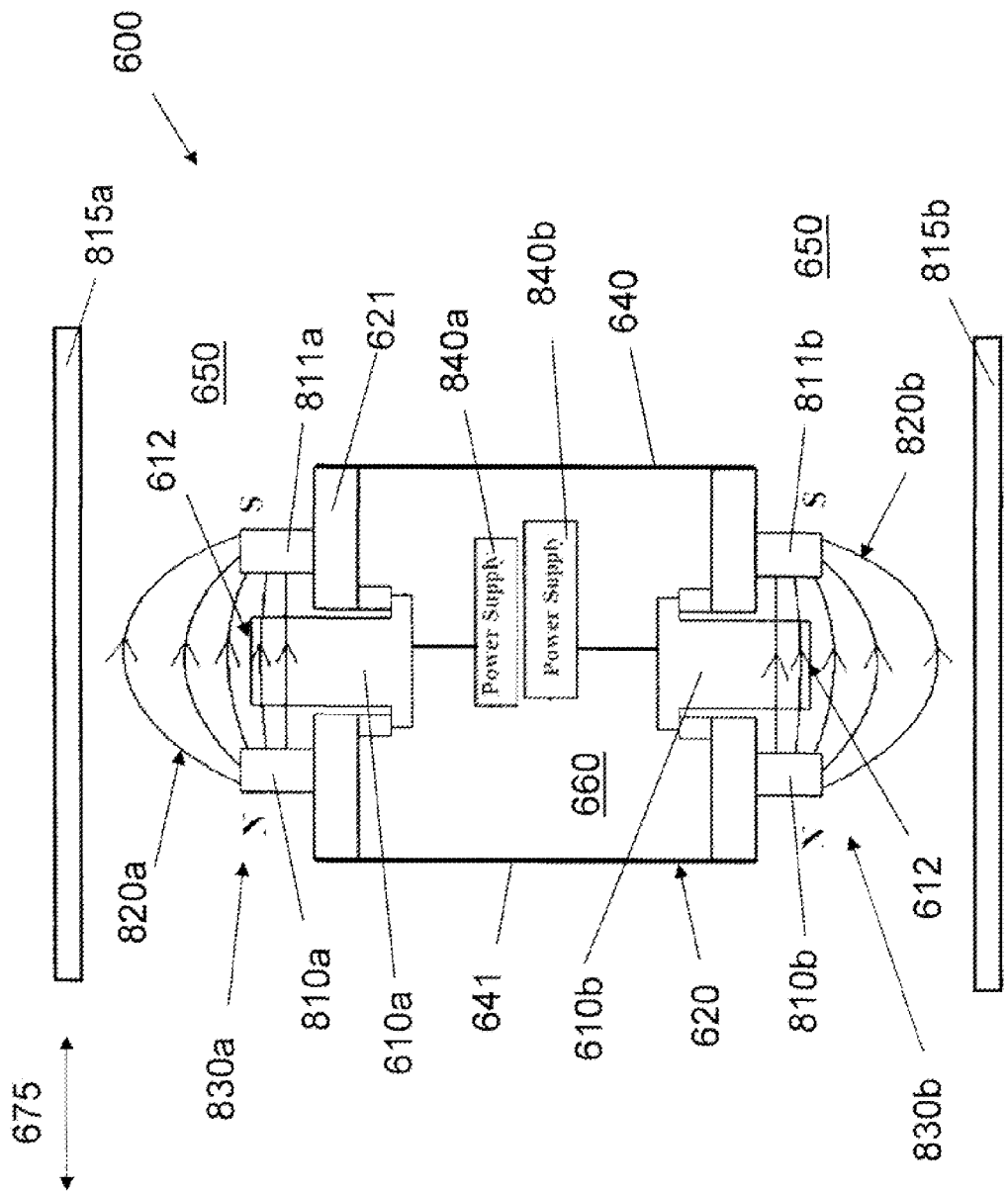
FIG. 8A is a detailed view of an arrangement of magnetron sources compatible with the processing system of FIGS. 5A-6C.

In some embodiments, referring to FIG. 8A (the outer chamber walls are not shown, the orientation is same as FIG. 6C), a magnetron source 830a can include a pair of magnets 810a and 811a on the two sides of a target 610a. The magnet 810a can have a "North" ("N") polarity and the magnet 811a can have a "South" ("S") polarity. Similarly, a magnetron source 830b can be held on the inner chamber wall 621 opposite to the magnetron source 830a across the space 660. The magnetron source 830b can include a pair of magnets 810b and 811b on the two sides (above and below) of the target 610b. The magnet 810b can have a "North"0 polarity and the magnet 811b a "South" polarity. The magnets 810a, 811a, 810b, and 811b can include permanent magnets such as rare earth magnets and ceramic magnet that can be used individually or be connected with ferromagnetic material such as 400 series stainless steel and Mu-metal.

Figure 8B:
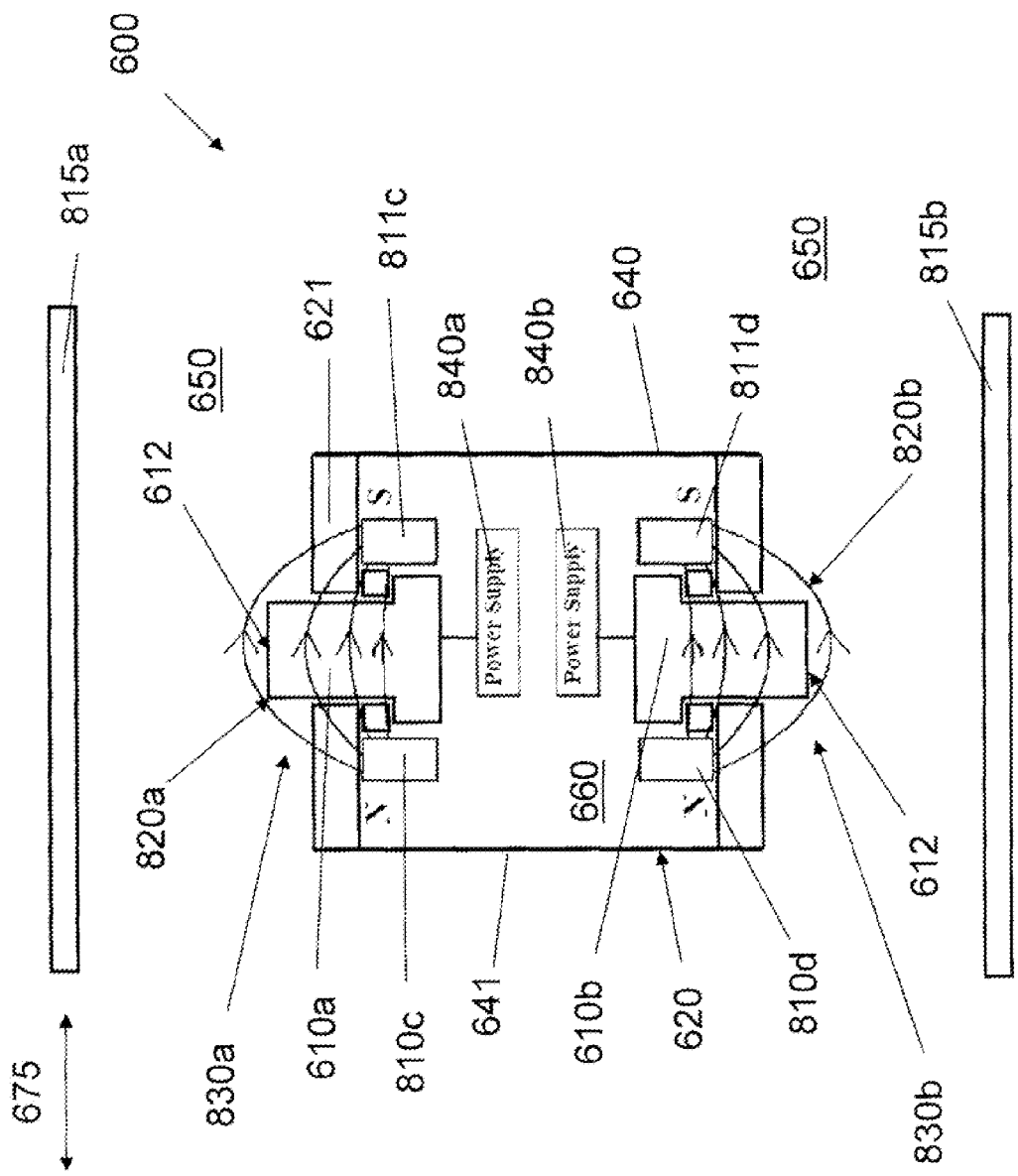
FIG. 8B is a detailed view of another arrangement of magnetron sources compatible with the processing system of FIGS. 5A-6C.

The magnets 810a and 811a can produce magnetic flux lines 820a. Some of the magnetic flux lines 820a are substantially parallel to the sputtering surface 612 that can be exposed in a vacuum environment in the space 650. The magnetic field flux lines 820a have large components parallel to the sputtering surface 612 on the target 610a. Electrons can depart from the sputtering surface 612 (cathode) at a high velocity due to negative bias on the target 610a. Lorenz forces due to the magnetic fields can bend the electron paths back to the sputtering surface 612. The increased electron density near the sputtering surface 612 can enhance the plasma ionization efficiency. A substrate 815a is positioned to receive materials sputtered off the target 610a. Similarly, the magnetron source 830b can include, as shown in FIG. 8, a pair of permanent magnets 810b and 811b on the two sides (above and below) of the target 610b. The magnet 810b can have a "North" polarity and the magnet 811b a "South" polarity. The magnets 810b and 811b can produce magnetic flux lines 820b. Some of the magnetic flux lines 820b can be substantially parallel to the sputtering surface 612 that can be exposed in a vacuum environment in the space 650. A substrate 815b is positioned to receive materials sputtered off the target 610b.

The magnets 810a, 810b and magnets of the "North" polarity on the other inner chamber walls 621 can form a close loop. The magnets 811a, 811b and magnets of the "South" polarity on the other inner chamber walls 621 can form another close loop. The magnet flux lines between the two close-loop magnets can form a close-loop electron path that can effectively confine the movement of free electrons near the sputtering surfaces 612 of the targets around the space 650. The electrons can be confined near the maximum magnetic field that is parallel to the sputtering surfaces 612. The electrons can hop along the path in the close loop. Since the magnets 810a, 810b, 811a and 811b are placed on the two sides the target 610a or 610b instead of behind the sputtering surface 612 of the target 610a or 610b, the target 610a or 610b can be thick or made of magnetic materials and still have strong magnetic flux over the sputtering surface 612. Furthermore, the magnetic flux line 820a and 820b are more uniform compared to conventional sputtering source where the magnets are behind the target, it result in more uniform sputtering rate across the sputtering surface 612, more uniform erosion pattern and improves the target utilization.

The magnets 810a, 810b, 811a, and 811b in FIG. 8A are next to the space 650 and can be exposed to the vacuum environment. In some embodiments, referring to FIG. 8B, magnets 810c, 810d, 811c, and 811d can be positioned next to the space 660 and behind the sputtering surfaces 612. The magnets 810c, 810d, 811c, and 811d can thus be outside of the vacuum environment.

Figure 9:
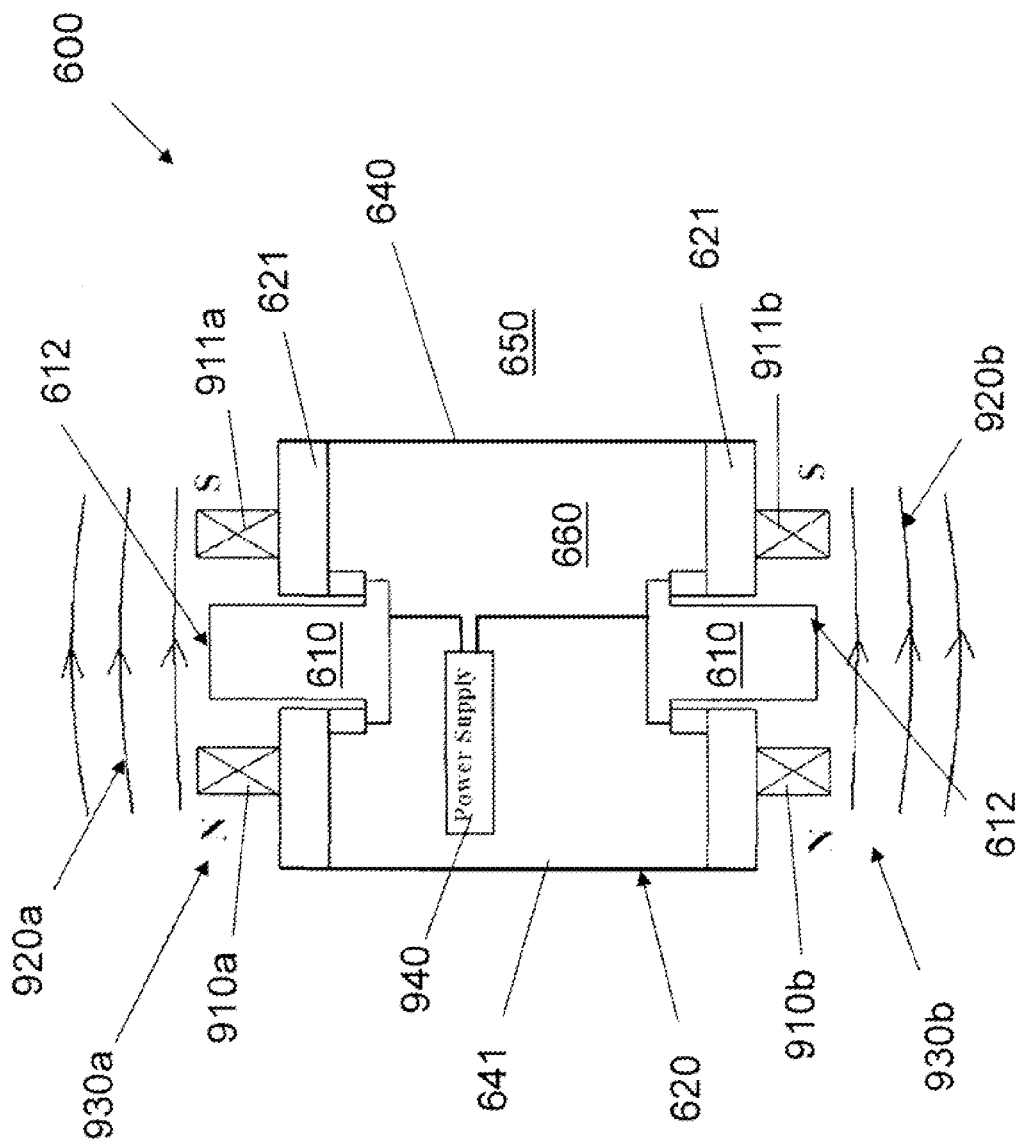
FIG. 9 is a detailed view of another arrangement of magnetron sources compatible with the processing system of FIGS. 5A-6C.

Referring to FIG. 9 (the substrates and the outer chamber walls are not shown), the magnetron source 930a and 930b can also include electric conductor coils or electromagnets 910a, 911a, 910b, and 911b that can generate magnetic flux lines 920a and 920b similar to the permanent magnet 810a, 811a, 810b, and 811b. A power supply 940 can be shared for the magnetron source 930a and 930b, or different power supplies can be separately connected to magnetron sources 930a and 930b and be controlled independently. The power supply 940 can provide electric biases between the targets 610 and the chamber 620. The power supply 940 can provide Direct Current (DC), Alternative Current (AC) or Radio Frequency (RF) in addition to a DC voltage bias. In the illustration, we have shown the electrical magnets next to the target in the vacuum side. Same effect can be achieved when electrical magnets are placed behind the target outside the vacuum area.

Figure 10A:
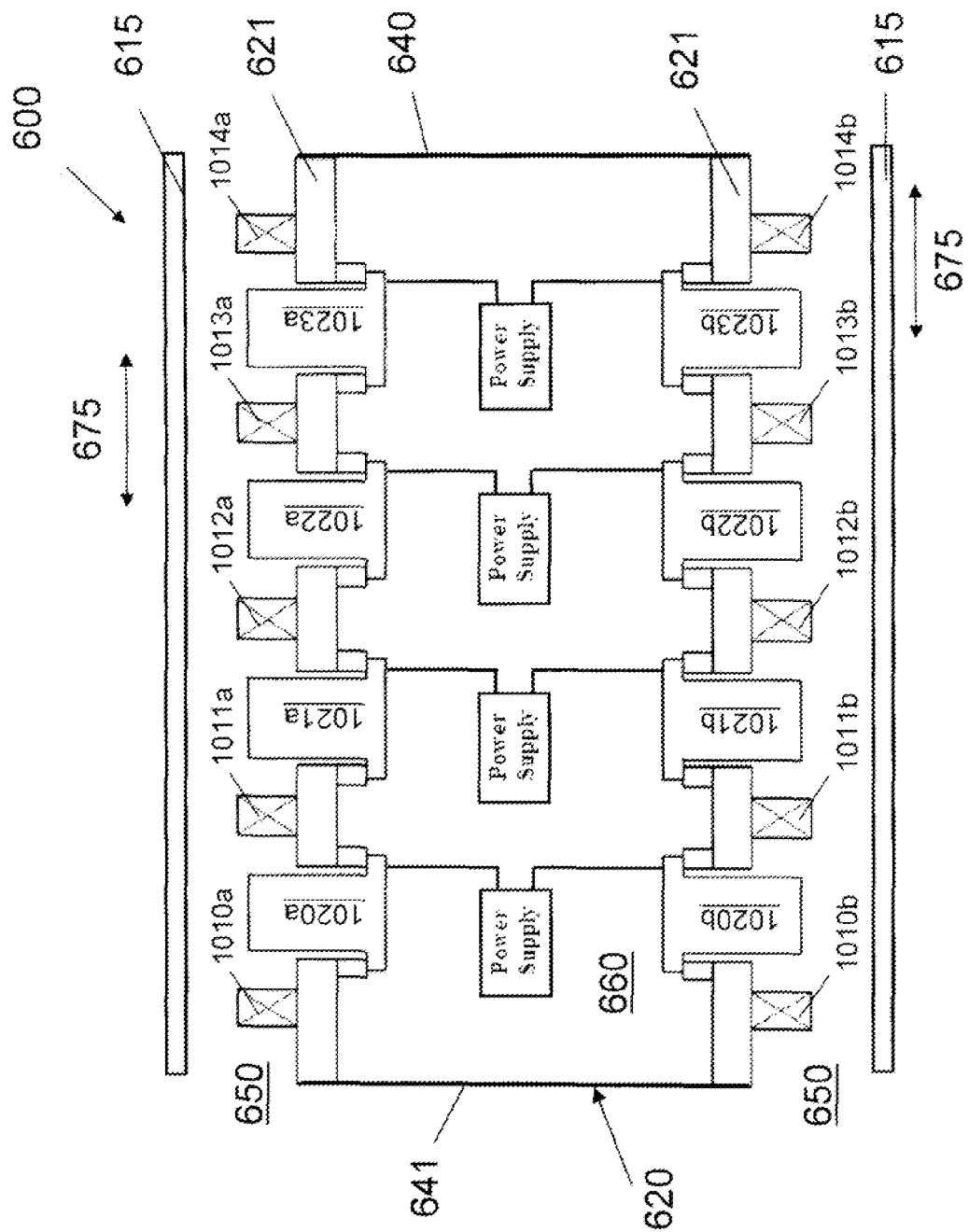
FIG. 10A shows a processing system including a plurality of magnetron sources including electromagnetic coils and a plurality of targets on an inner chamber wall.
Figure 10B:
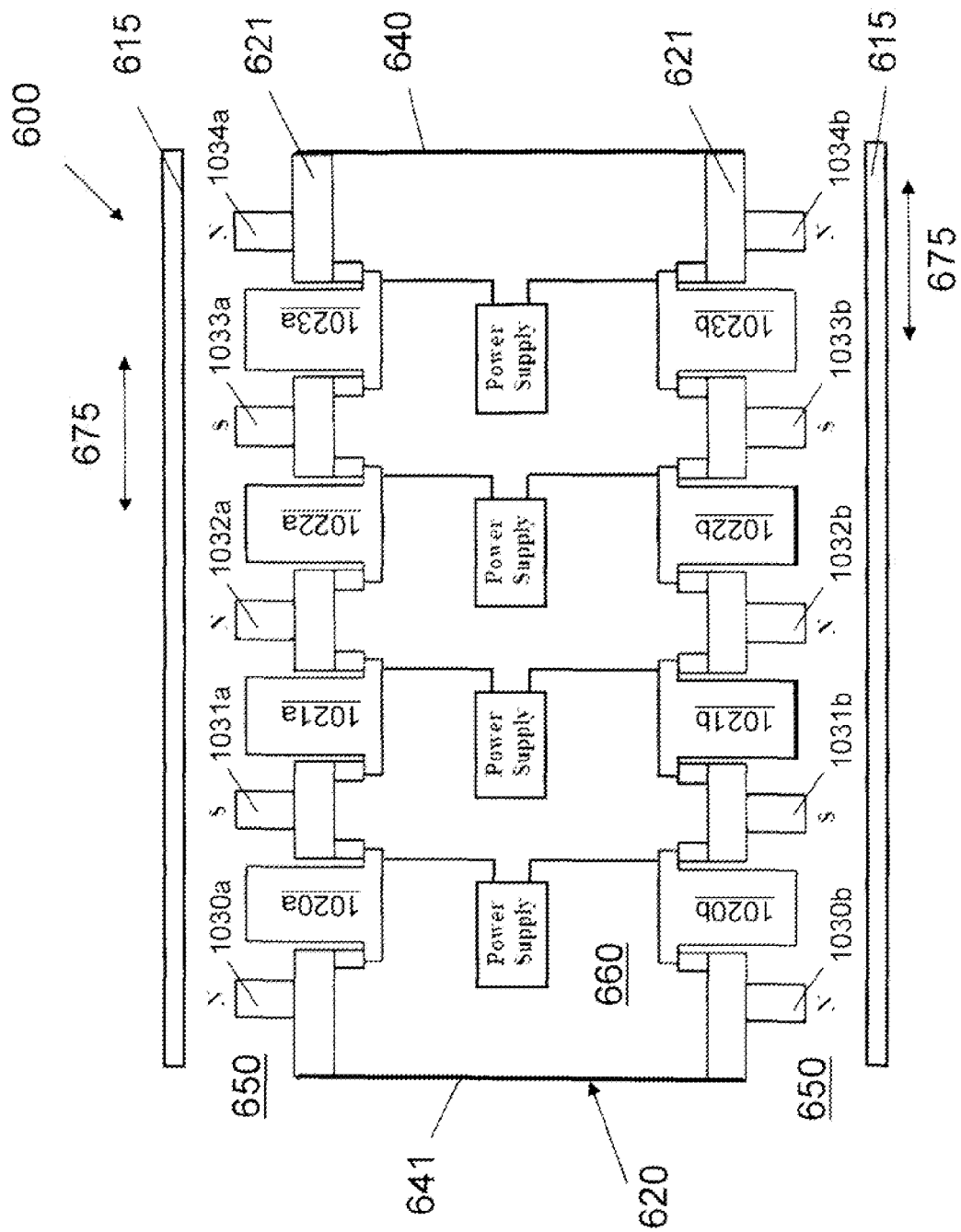
FIG. 10B shows a processing system including a plurality of magnetron sources including permanent magnets and a plurality of targets on an inner chamber wall.

In some embodiments, referring to FIGS. 10A and 10B, a processing system 600 can include a plurality of targets 1020a, 1021a, 1022a, and 1023a positioned on an inner chamber wall 621 and a plurality of targets 1020b, 1021b, 1022b, and 1023b positioned on another inner chamber wall 621. A plurality of electric conductor coils 1010a-1014a, 1010b-1014b (FIG. 10A) or permanent magnets 1030a-1034a, 1030b-1034b (FIG. 10B) can be alternatively positioned on the two sides of each of the targets 1010a-1014a and 1010b -1014b to provide magnetic fields near the sputtering surfaces of the respective targets 1010a-1014a and 1010b-1014b. Shields can be added between the adjacent targets 1010a-1013a and 1010b-1013b to prevent or minimize cross contamination. The substrate 615 can be transported along the direction 675 so that different receiving areas of the substrate 615 can be brought in front of the targets 1010a-1013a or 1010b-1013b to receive sputtered material.

The targets 1010a-1013a or 1010b-1013b can include comprise substantially the same or different target materials.

Figure 11:
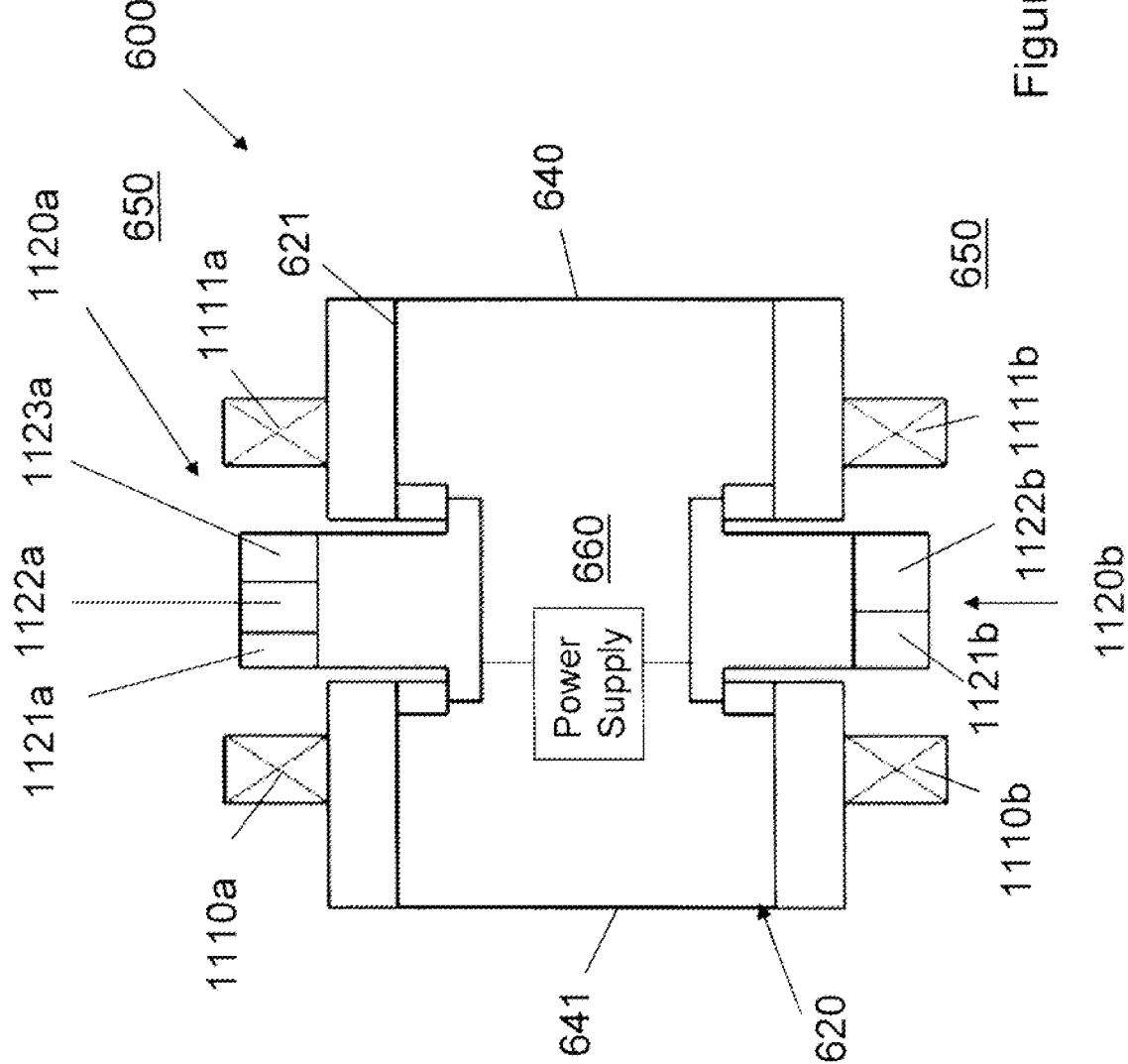
FIG. 11 shows a target comprising multiple target materials for a magnetron source associated with the target.

In some embodiments, referring to FIG. 11, a processing system 600 can include a target 1120a including three target materials 1121a, 1122a, 1123a and a target 10020b that includes two target materials 1121b and 1122b. The target materials 1121a, 1122a, 1123a are positioned between electric conductor coils 1110a and 1111a (or permanent magnets). The target materials 1121a, 1122a, 1123a can be made of the same or different target materials. The target materials 1121b and 1122b are positioned between electric conductor coils 1110b and 1111b (or permanent magnets) can also be made of the same or different target materials. The different materials in a target 1120a or 1120b allow different material compositions to be deposited on the deposition surfaces of the substrate 615 (not shown in FIG. 11).

In some embodiments, referring to FIGS. 12A and 12B, a processing system 1200 can include a chamber 1220 that includes one or more walls 1225, and a plurality of targets 1210a, 1210b in the chamber 1220. The chamber encloses a space 1250 that can be evacuated during sputtering deposition or other type of deposition methods. The targets 1210a, 1210b can be held on an enclosure 1270 within the space 1250. The enclosure 1270 can define a space 1260 within that can be outside of a vacuum environment during sputtering deposition. The processing system 1200 can also include a plurality of web-form substrate 1215a and 1215b. Each of the web-form substrate 1215a and 1215b can be conveyed by a pair of pick-up and feed rollers 1230a, 1231a or 1230b, 1231b. In some embodiments, referring to FIG. 13, the processing system 1200 can include a chamber 1320 that has a round or cylindrically shaped chamber wall 1325. The inner vacuum enclosure 1270 can also be circular shaped, even if the various deposition sources are substantially planar.

It is understood that the disclosed system and methods are not limited to the specific description in the specification. A hexagon is used to illustrate the principles; many polygonal shapes can be used in place of the hexagon. For example, the disclosed system is suitable for material depositions on large or small substrates. In addition, the substrate can be heated and/or applied with an electric bias voltage. The processing system can also include a vacuum load-lock and a cleaning chamber for cleaning the substrate. The substrate transport mechanism can also take various forms without deviating from the spirit of the specification. The sources can also be transported relative to the substrates. Furthermore, the targets compatible with the disclosed processing system can include thermal evaporation source, sublimation sources, ion beam sources, perforated plates for gas distribution, positive biased plate for sputter etching the substrate, anode plate for etching and reactive ion etching (RIE), shower head for plasma enhanced chemical vapor deposition (PECVD), magnet field enhanced PECVD, thermal assisted CVD shower head, and electron cyclotron resonance (ECR) enhanced plasma. Substrate can be heated, voltage biased, sputter cleaned and rotated inside vacuum. An insulator can be provided between a target and the deposition chamber. The insulator can be positioned inside or outside of the vacuum environment. Furthermore, the chamber can include holders for the substrates and the targets. The disclosed substrates and targets in the chamber are compatible with different holder mechanisms.

Figure 14:
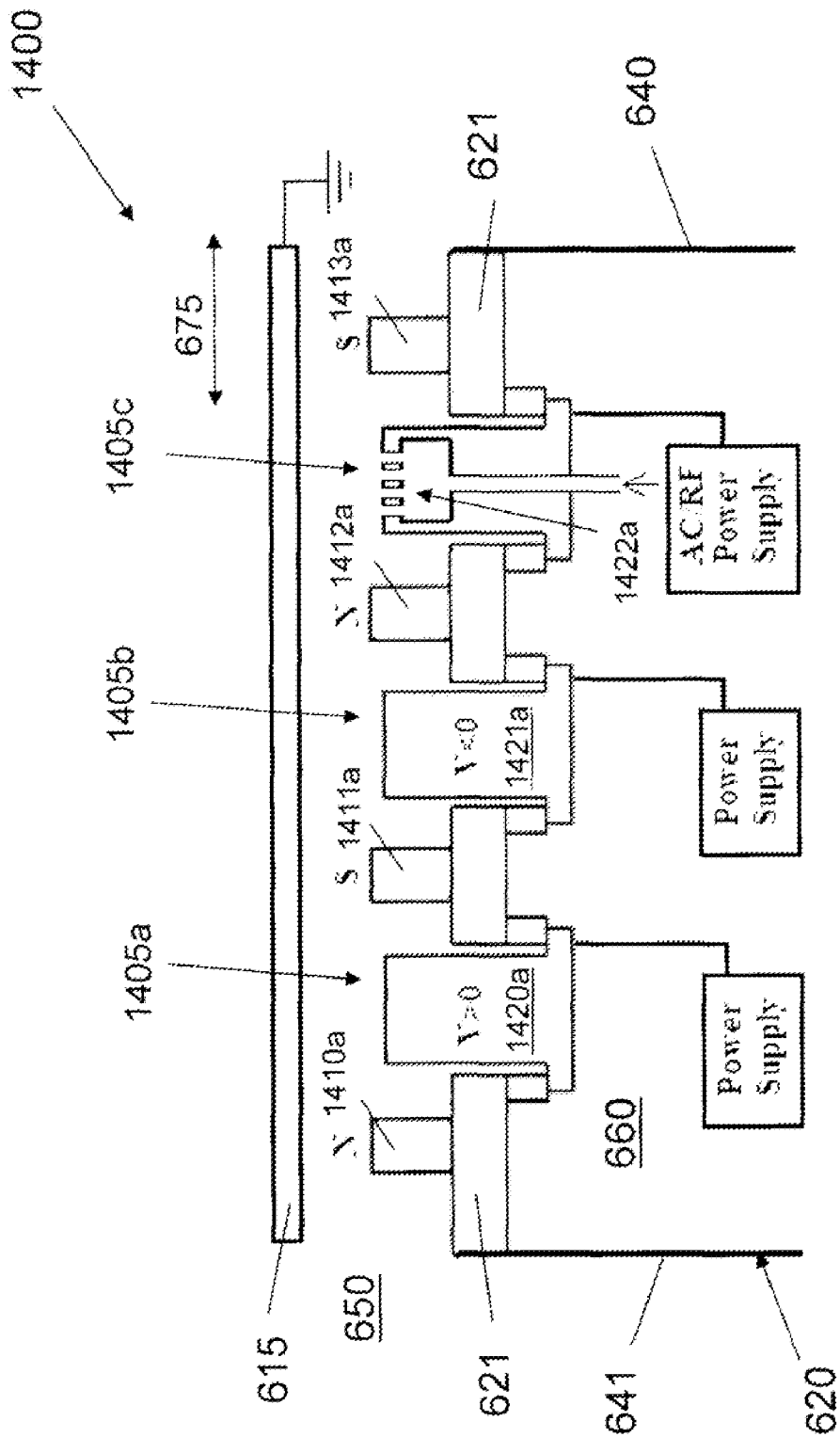
FIG. 14 is a partial cross sectional view of a processing system having multiple different sources for processing a substrate.

In some embodiments, referring to FIG. 14, a processing system 1400 can include multiple processing stations 1405a, 1405b, and 1405c that can provide different processing steps on a single substrate 615. The processing stations 1405a, 1405b, and 1405c can be separated by magnets 1410a-1413a having alternating polarities. The magnets 1410a-1413a can include permanent magnets, electric conductor coils, and electromagnets.

The processing station 1405a is a sputter-etch station wherein the target 1420a is positively biased relative to the substrate 615. An optional magnetron source including the magnets 1410a and 1411a can be positioned by the targets to enhance plasma density and increase the sputter etch rate of the substrate 615. The processing station 1405b includes a sputtering deposition magnetron source. The target 1421a is negatively biased relative to the substrate. The processing station 1405c includes a CVD source in which a gas is released toward the substrate 615 from the openings of a chamber 1422a. Chemical reactions at the surface of the substrate 615 can deposit a thin film on the substrate surface. An alternative current (AC) or radio frequency (RF) power can be applied within to the chamber 1422a to ionize the precursor gas molecules to enhance the chemical vapor deposition. The optional magnetron formed by magnets 1412a and 1413a can enhance the plasma density between the chamber 1422a and the substrate 615.

A processing system including the multiple sources shown in FIG. 14 can be used to sequentially deposit multiple layers of material on a substrate. As the substrate is transported, the substrate can be cleaned by the energetic ions in the sputter etch station 1405a. The substrate can also be heated by the station 1405a. The substrate can then be coated with various sputtered films and CVD films. The various processing steps can be carried out simultaneously or at different times.

The configuration shown in FIG. 14 is compatible with previously disclosed processing systems (e.g. 300, 600, and 1200). Different substrates in a deposition chamber may have the same or different configurations of the multiple processing stations.

What is claimed is:

1. A deposition system, comprising:
a chamber comprising one or more outer chamber walls and one or more inner chamber walls, wherein the one or more outer chamber walls are positioned around a center axis, wherein the one or more inner chamber walls are positioned around the center axis, wherein the one or more outer chamber walls and the one or more inner chamber walls define a vacuum enclosure in between;
a plurality of substantially planar targets mounted on the one or more inner chamber walls and in the vacuum enclosure, wherein the sputtering surfaces of the plurality of targets are positioned substantially along the sides of a first polygon around the center axis;
a plurality of substantially planar backing plates each mounted on the one or more inner chamber walls and on the opposing side of one of the plurality of targets;
a plurality of magnetron sources adjacent to one of the plurality of substantially planar backing plate and configured to produce a substantially uniform magnetic field near the sputtering surface on the one of the plurality of substantially planar targets;
a plurality of substrates outside and surrounding the plurality of substantially planar targets in the chamber, wherein the plurality of substrates comprise deposition surfaces substantially facing toward the plurality of substantially planar targets and configured to receive materials sputtered off the sputtering surfaces; and
a transport mechanism configured to move the plurality of substrates in a direction parallel to the center axis.

2. The deposition system of claim 1, wherein the plurality of sputtering surfaces are parallel to the center axis.

3. The deposition system of claim 1, wherein the plurality of deposition surfaces are parallel to the center axis.

4. The deposition system of claim 1, wherein at least one of the deposition surfaces is substantially parallel to one of the plurality of sputtering surfaces.

5. The deposition system of claim 1, wherein the plurality of substantially planar backing plates are positioned substantially along the sides of the first polygon.

6. The deposition system of claim 1, wherein the deposition surfaces of the plurality of substrates are positioned substantially along the sides of a second polygon outside of the first polygon.

7. The deposition system of claim 1, wherein at least one of the plurality of substrate is configured to receive materials sputtered off the sputtering surfaces of two substantially planar targets along two adjacent sides of the first polygon.

8. A deposition system, comprising:
a chamber comprising one or more outer chamber walls positioned around a center axis and one or more inner chamber walls positioned around the center axis, wherein the one or more outer chamber walls define a vacuum enclosure, wherein the one or more inner chamber walls define a space inside the vacuum enclosure;
a plurality of targets mounted on the one or more inner chamber walls and in the vacuum enclosure, wherein the plurality of targets comprise sputtering surfaces facing substantially away from the one or more inner chamber walls, wherein the plurality of the targets are positioned in a loop around the center axis;
a plurality of substrates outside and surrounding the plurality of targets in the chamber, wherein the plurality of substrates comprise deposition surfaces substantially facing toward the one or more inner chamber walls and configured to receive materials sputtered off the sputtering surfaces; and
a transport mechanism configured to move the plurality of substrates in a direction parallel to the center axis to obtain uniform deposition of the materials sputtered of the sputtering surfaces.

9. The deposition system of claim 8, further comprising:
a plurality of substantially planar backing plates each mounted on the one or more inner chamber walls and on the opposing side of one of the plurality of targets.

10. The deposition system of claim 9, further comprising a plurality of magnetron sources each positioned in the space inside of the inner chamber walls and adjacent to one of the plurality of substantially planar backing plate and configured to produce a substantially uniform a magnetic field near the sputtering surface on the one of the plurality of substantially planar targets.

11. The deposition system of claim 8, wherein the sputtering surfaces are positioned along the sides of a polygon and parallel to the center axis.

12. The deposition system of claim 8, wherein the deposition surfaces are positioned along the sides of a polygon and parallel to the center axis.

13. The deposition system of claim 8, wherein the plurality of targets are positioned in an inner close-loop surrounding the inner chamber walls, and wherein the plurality of substrates are positioned in an outer close-loop outside of the inner close-loop.

14. A deposition system, comprising:
a chamber comprising one or more outer chamber walls and one or more inner chamber walls, wherein the one or more outer chamber walls are positioned around a center axis, wherein the one or more inner chamber walls are positioned around the center axis, wherein the one or more outer chamber walls and the one or more inner chamber walls define a vacuum enclosure in between;
a plurality of substantially planar targets mounted on the one or more inner chamber walls and in the vacuum enclosure, wherein the plurality of targets are positioned in an inner close-loop around the center axis;
a plurality of substantially planar backing plates each mounted on the one or more inner chamber walls and on the opposing side of one of the plurality of targets;
a plurality of magnetron sources each adjacent to one of the plurality of substantially planar backing plate and configured to produce a substantially uniform magnetic field near the sputtering surface on the one of the plurality of substantially planar targets;
a plurality of substrates positioned in an outer close-loop around the center axis and outside of the inner close-loop, wherein the plurality of substrates and the plurality of targets are positioned in pairs, wherein each of the plurality of substrates comprises a deposition surfaces facing the sputtering surface of the target paired with the substrate; and
a transport mechanism configured to move the plurality of substrates in a direction parallel to the center axis.

15. The deposition system of claim 14, wherein the sputtering surfaces of the plurality of targets are positioned substantially along the sides of a polygon and parallel to the center axis.

16. The deposition system of claim 14, wherein at least one of the plurality of deposition surfaces is substantially parallel to one of the sputtering surfaces.

17. The deposition system of claim 14, wherein the deposition surfaces are positioned substantially along the sides of a polygon and parallel to the center axis.

18. The deposition system of claim 14, wherein the magnetic fields are configured to confine electrons in a close-loop electron path near the sputtering surfaces on the plurality of targets in the inner close-loop.

19. The deposition system of claim 14, wherein at least one of the plurality of substrates is configured to receive material sputtered off from two of the plurality of targets.

* * * * *